United States Patent
Tzeng et al.

(10) Patent No.: US 11,087,671 B2
(45) Date of Patent: Aug. 10, 2021

(54) PIXEL STRUCTURE

(71) Applicant: Au Optronics Corporation, Hsinchu (TW)

(72) Inventors: Bo-Shiang Tzeng, Kaohsiung (TW); Chia-Ting Hsieh, Hsinchu (TW); Pin-Miao Liu, Hsinchu County (TW); Shih-Hsing Hung, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/744,147

(22) Filed: Jan. 15, 2020

(65) Prior Publication Data

US 2020/0286421 A1 Sep. 10, 2020

(30) Foreign Application Priority Data

Mar. 5, 2019 (TW) .................................. 108107325

(51) Int. Cl.
*G09G 3/32* (2016.01)
*H01L 25/075* (2006.01)
*H01L 33/62* (2010.01)

(52) U.S. Cl.
CPC ........... *G09G 3/32* (2013.01); *H01L 25/0753* (2013.01); *H01L 33/62* (2013.01); *G09G 2300/0426* (2013.01)

(58) Field of Classification Search
CPC ............. G09G 3/32; G09G 2300/0426; G09G 2300/0439; G09G 2300/0443; G09G 2300/0842; H01L 25/0753; H01L 25/167; H01L 33/62
See application file for complete search history.

(56) References Cited

U.S. PATENT DOCUMENTS

| 8,791,474 B1* | 7/2014 | Bibl | ..................... G09G 3/3208 257/89 |
| 10,468,391 B2* | 11/2019 | Cok | ..................... H01L 25/167 |

(Continued)

FOREIGN PATENT DOCUMENTS

| CN | 105552085 | 5/2016 |
| CN | 106298852 | 1/2017 |
| CN | 107146806 | 9/2017 |

*Primary Examiner* — Liliana Cerullo
(74) *Attorney, Agent, or Firm* — JCIPRNET

(57) ABSTRACT

A pixel structure includes a data line, a first scan line, first and second transistors, first and second power lines, LED elements, a connection pattern, a first insulation layer, and a first conductive pattern. Each of the first transistor and the second transistor has a first end, a control end, and second end. Each LED element has a first electrode and a second electrode. The second power line is electrically coupled to the first electrodes. The connection pattern is electrically coupled between the second end of the first transistor and the control end of the second transistor. The first conductive pattern is disposed above the first insulation layer and electrically coupled between the second electrodes, the second electrodes are electrically coupled to the second end of the second transistor through the first conductive pattern, and the connection pattern and the first conductive pattern are overlapped in an orthogonal projection direction.

11 Claims, 23 Drawing Sheets

(56) References Cited

U.S. PATENT DOCUMENTS

| | | | |
|---|---|---|---|
| 2012/0229438 A1* | 9/2012 | Fujita | G09G 3/3283 |
| | | | 345/211 |
| 2017/0338211 A1* | 11/2017 | Lin | H01L 33/62 |
| 2018/0175268 A1* | 6/2018 | Moon | H01L 33/62 |
| 2020/0052033 A1* | 2/2020 | Iguchi | H01L 27/1225 |
| 2021/0020819 A1* | 1/2021 | Im | H01L 33/08 |

* cited by examiner

PIXEL STRUCTURE

CROSS-REFERENCE TO RELATED APPLICATION

This application claims the priority benefit of Taiwan application serial no. 108107325, filed on Mar. 5, 2019. The entirety of the above-mentioned patent application is hereby incorporated by reference herein and made a part of this specification.

TECHNICAL FIELD

The disclosure relates to a pixel structure; more particularly, the disclosure relates to a pixel structure having light-emitting diode (LED) elements.

DESCRIPTION OF RELATED ART

With the evolution of display technology, display panels with high resolution and small thickness are favored by the mainstream market. In recent years, due to the breakthroughs in the manufacturing technology of light-emitting diode (LED) elements, a micro-LED display device capable of arranging LED elements in an array has been developed. The device does not require any liquid crystal layer nor color filter, and thus the thickness of the display device is further reduced. Besides, the LED display is made of an inorganic material and therefore is more reliable and has longer life span as compared to an organic LED display.

At present, during the manufacturing process of the micro-LED, a mass transfer technology has to be applied to move a significant number of LED elements. However, the existing display devices are usually equipped with millions of pixels, and the size of the LED elements is small, which leads to the difficulty in performing a picking-up action and an alignment action. Owing to the alignment errors, the LED elements cannot be accurately placed at predetermined locations, whereby the LED elements cannot be driven as usual. Moreover, in the event that the area occupied by the pixel structure is small, the conductive electrodes stacked in an up-and-down manner may interfere with the LED elements, thus further generating abnormal signals of the LED elements and causing a decrease in yield. Therefore, it is necessary to find a method for improving the yield of the micro-LED to ensure the micro-LED display device to have high resolution.

SUMMARY

The disclosure provides a pixel structure which features good pixel design, improves the resolution of a light-emitting diode (LED) device, and has high yield.

In an embodiment, a pixel structure includes a data line, a first scan line, a first transistor, a second transistor, a first power line, a plurality of LED elements, a second power line, a connection pattern, a first insulation layer, and a first conductive pattern. The pixel structure is disposed on a substrate. The data line and the first scan line cross over with each other. The first transistor has a first end, a control end, and a second end, wherein the first end of the first transistor is electrically coupled to the data line, and the control end of the first transistor is electrically coupled to the first scan line. The second transistor has a first end, a second end, and a control end. The first power line is electrically coupled to the first end of the second transistor. Each of the LED elements has a first electrode and a second electrode. The second power line is electrically coupled to the first electrodes of the LED elements. The connection pattern is electrically coupled between the second end of the first transistor and the control end of the second transistor. The first insulation layer is disposed above the connection pattern. The first conductive pattern is disposed above the first insulation layer and electrically coupled between the second electrodes of the LED elements, wherein the second electrodes of the LED elements are electrically coupled to the second end of the second transistor through the first conductive pattern, and the connection pattern and the first conductive pattern are overlapped in an orthogonal projection direction perpendicular to the substrate.

According to an embodiment of the invention, an orthogonal projection of the first conductive pattern is located between a plurality of orthogonal projections of the second electrodes of the LED elements.

According to an embodiment of the invention, an orthogonal projection of the connection pattern is located between the orthogonal projections of the LED elements.

According to an embodiment of the invention, the orthogonal projection of the connection pattern is within the orthogonal projection of the first conductive pattern.

According to an embodiment of the invention, an area occupied by an orthogonal projection of the connection pattern is A1, an area occupied by an orthogonal projection of the first conductive pattern is A2, and $0.2 \leq A1/A2 < 0.75$.

According to an embodiment of the invention, the first insulation layer has a through hole overlapped with the second end of the second transistor, and the pixel structure further includes a first connecting pattern disposed on the first insulation layer, electrically coupled to the second end of the second transistor through the through hole of the first insulation layer, and electrically coupled between the first conductive pattern and the second end of the second transistor, wherein at least one portion of the through hole and the connection pattern are overlapped in the orthogonal projection direction.

According to an embodiment of the invention, the pixel structure further includes a second insulation layer disposed on the first connecting pattern and having a through hole overlapped with the first connecting pattern. The second connecting pattern is disposed on the second insulation layer and located between the first conductive pattern and the second insulation layer, wherein the second connecting pattern is electrically coupled to the first connecting pattern through the through hole of the second insulation layer and electrically coupled between the first conductive pattern and the first connecting pattern, and at least one portion of the through hole of the second insulation layer and the connection pattern are overlapped in the orthogonal projection direction.

According to an embodiment of the invention, the pixel structure further includes a second scan line crossing over with the data line, and the third transistor has a first end, a control end, and a second end, wherein the first end of the third transistor is electrically coupled to the second electrodes of the LED elements, the control end of the third transistor is electrically coupled to the second scan line, and the orthogonal projection of the at least one portion of the through hole of the first insulation layer and the orthogonal projection of the at least one portion of the through hole of the second insulation layer are located between an orthogonal projection of the first transistor and an orthogonal projection of the third transistor.

According to an embodiment of the invention, the pixel structure further includes a third insulation layer disposed on the second connecting pattern and having a through hole, wherein the first conductive pattern is disposed on the third insulation layer and electrically coupled to the second connecting pattern through the through hole of the third insulation layer, and at least one portion of the through hole of the third insulation layer and the connection pattern are overlapped in the orthogonal projection direction.

According to an embodiment of the invention, the pixel structure further includes a second scan line crossing over with the data line, and the third transistor has a first end, a control end, and a second end, wherein the first end of the third transistor is electrically coupled to the second electrodes of the LED elements, and the control end of the third transistor is electrically coupled to the second scan line. The orthogonal projection of the at least one portion of the through hole of the third insulation layer is located between an orthogonal projection of the first transistor and an orthogonal projection of the third transistor.

According to an embodiment of the invention, a material of the first insulation layer includes an organic material.

According to an embodiment of the invention, the pixel structure further includes a fourth insulation layer disposed on the first insulation layer and having a through hole, wherein the through hole of the fourth insulation layer and the through hole of the first insulation layer are overlapped, the first connecting pattern is disposed on the fourth insulation layer, and the first connecting pattern is electrically coupled to the second end of the second transistor through the through hole of the fourth insulation layer and the through hole of the first insulation layer.

In view of the above, the pixel structure provided in one or more embodiments of the invention has the connection pattern connected between the second end of the first transistor and the control end of the second transistor and the first conductive pattern electrically connected to the second electrodes of two LED elements. The connection pattern and the first conductive pattern are not prone to interference by electrical signals, and the orthogonal projections of the connection pattern and the first conductive pattern are overlapped, so as to further reduce the area occupied by the pixel structure and ensure the LED display device to have high resolution.

To make the above features and advantages provided in one or more of the embodiments of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles described herein.

FIG. 2A to FIG. 2K are schematic cross-sectional views illustrating a process of manufacturing an LED display device according to an embodiment of the invention.

DESCRIPTION OF THE EMBODIMENTS

Figure 1A:
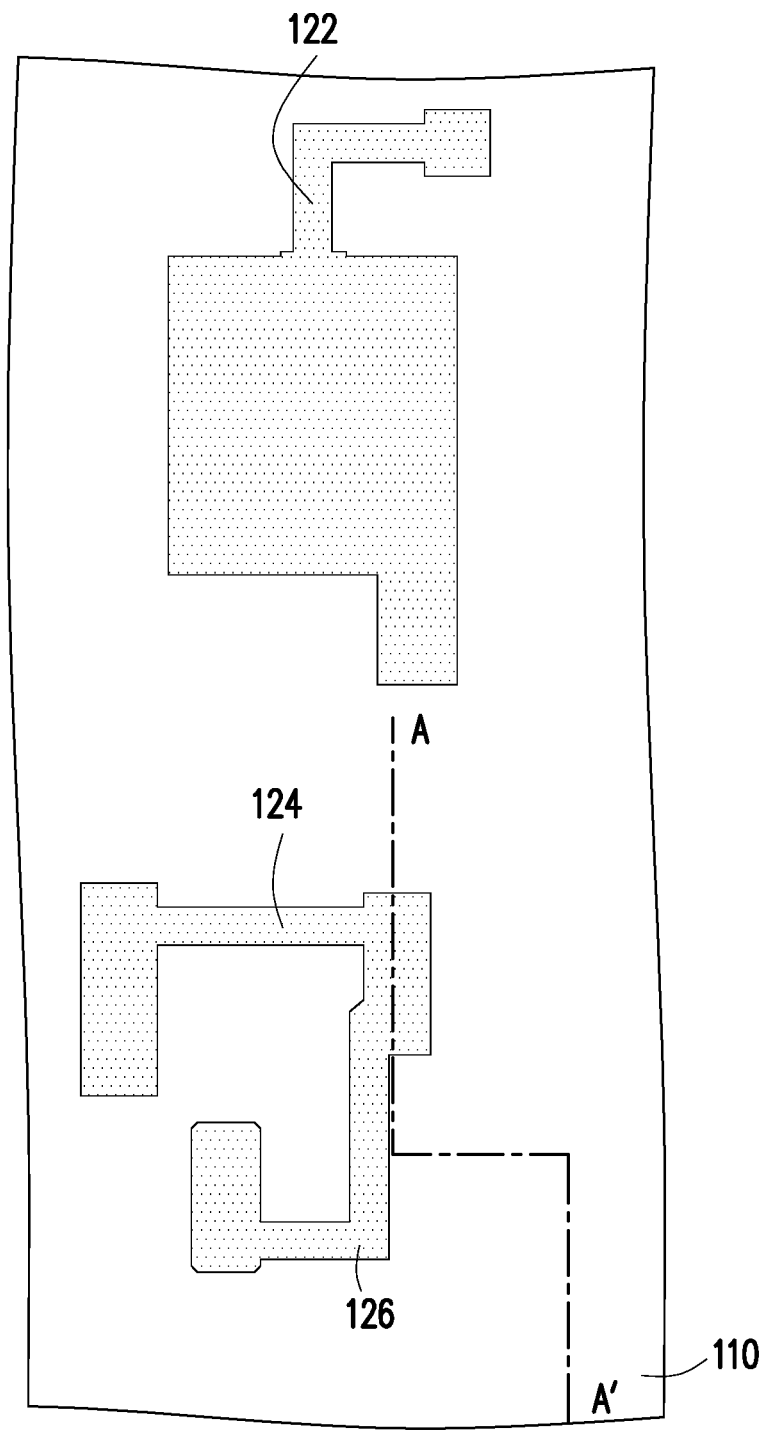
FIG. 1A to FIG. 1K are schematic top views illustrating a process of manufacturing a light-emitting diode (LED) display device according to an embodiment of the invention.
Figure 1B:
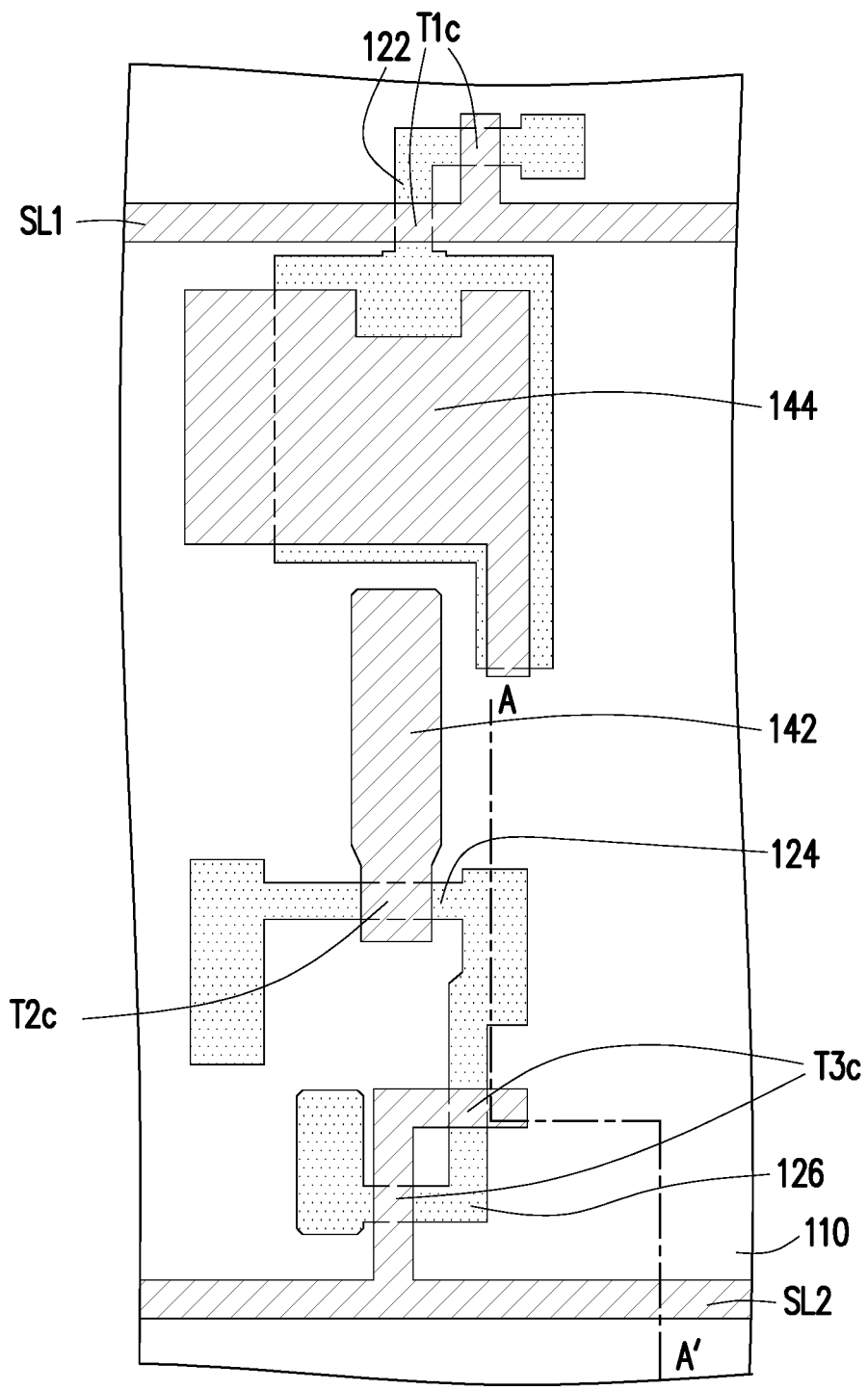
Figure 1C:
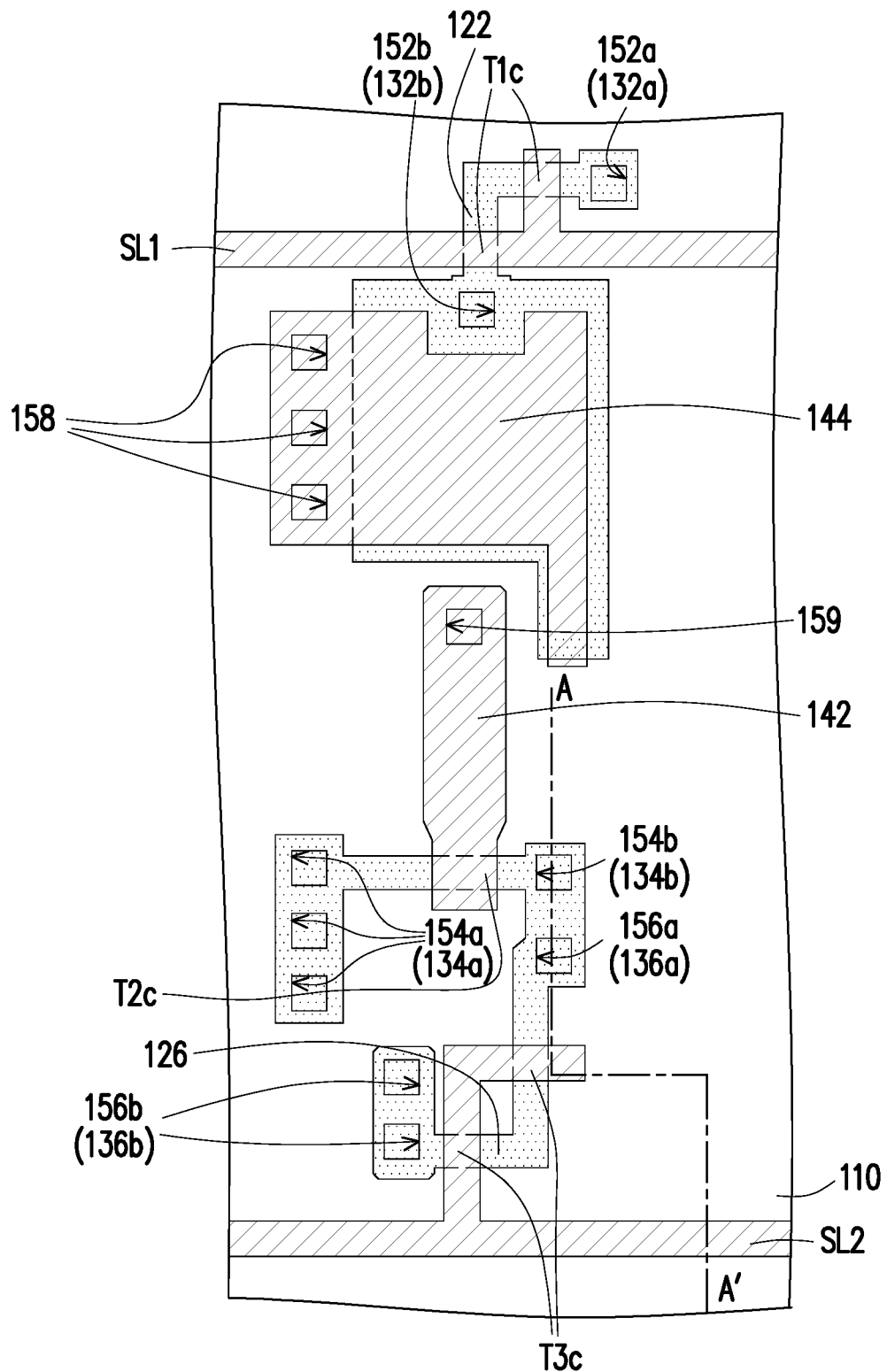
Figure 1D:
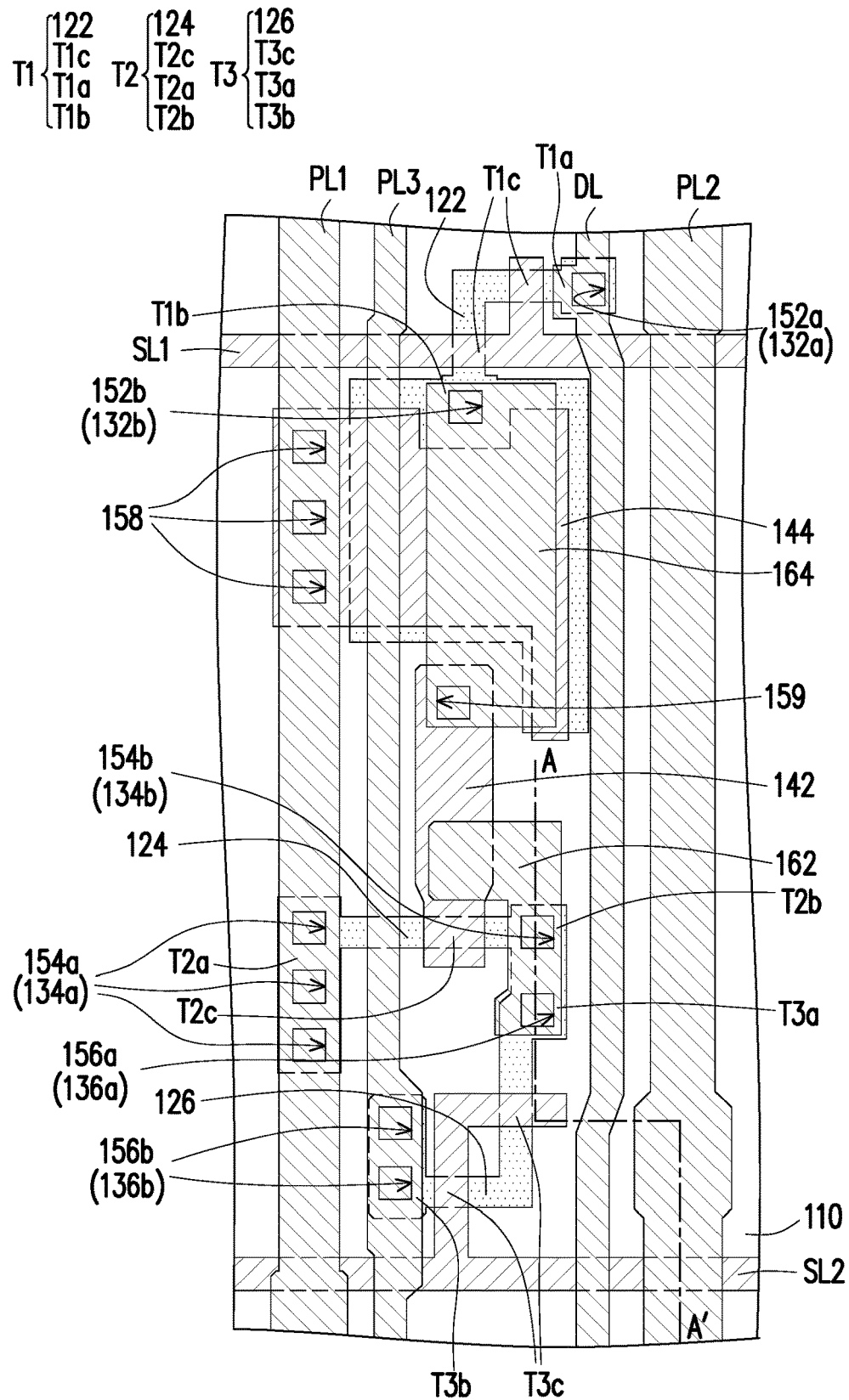
Figure 1E:
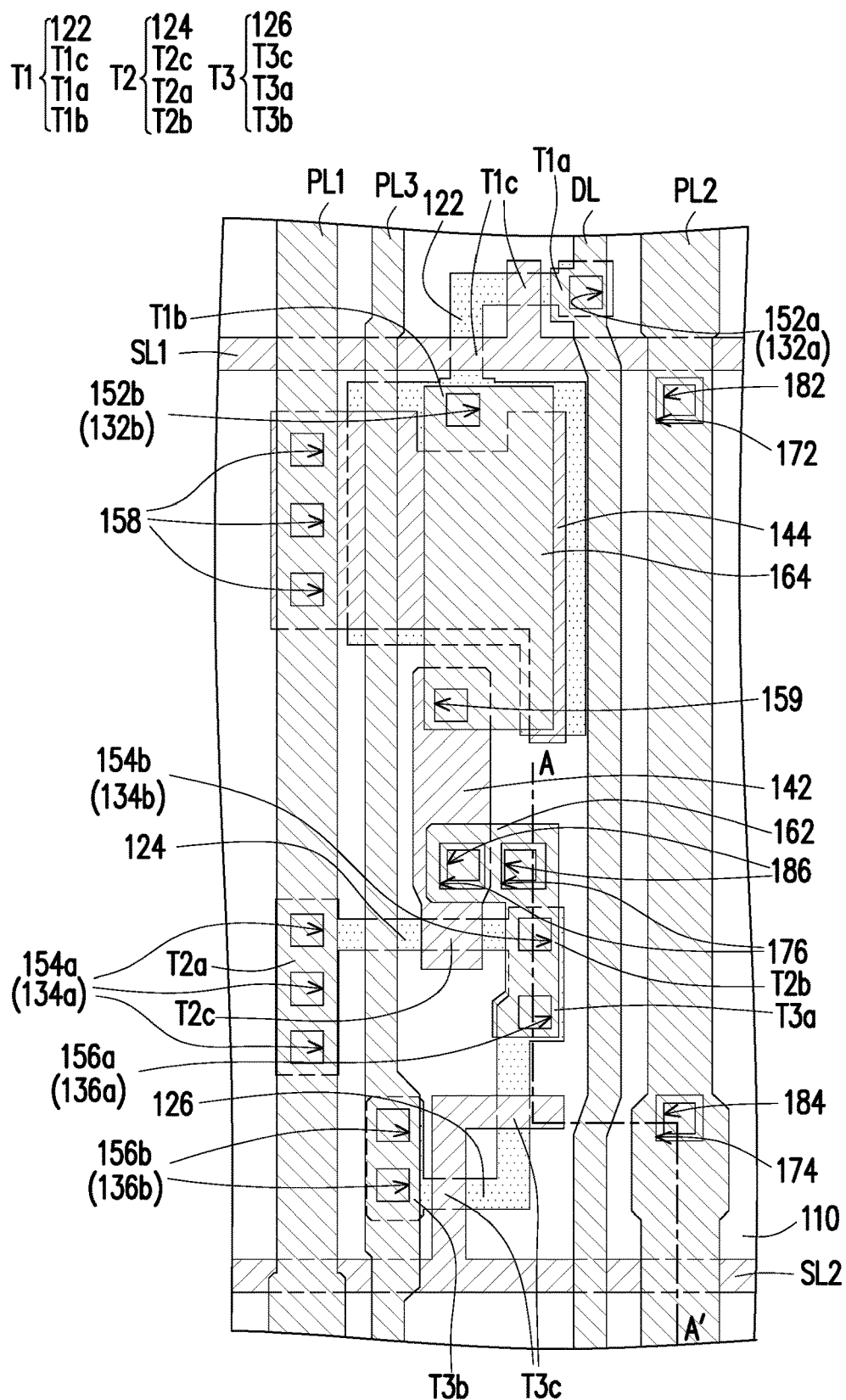
Figure 1F:
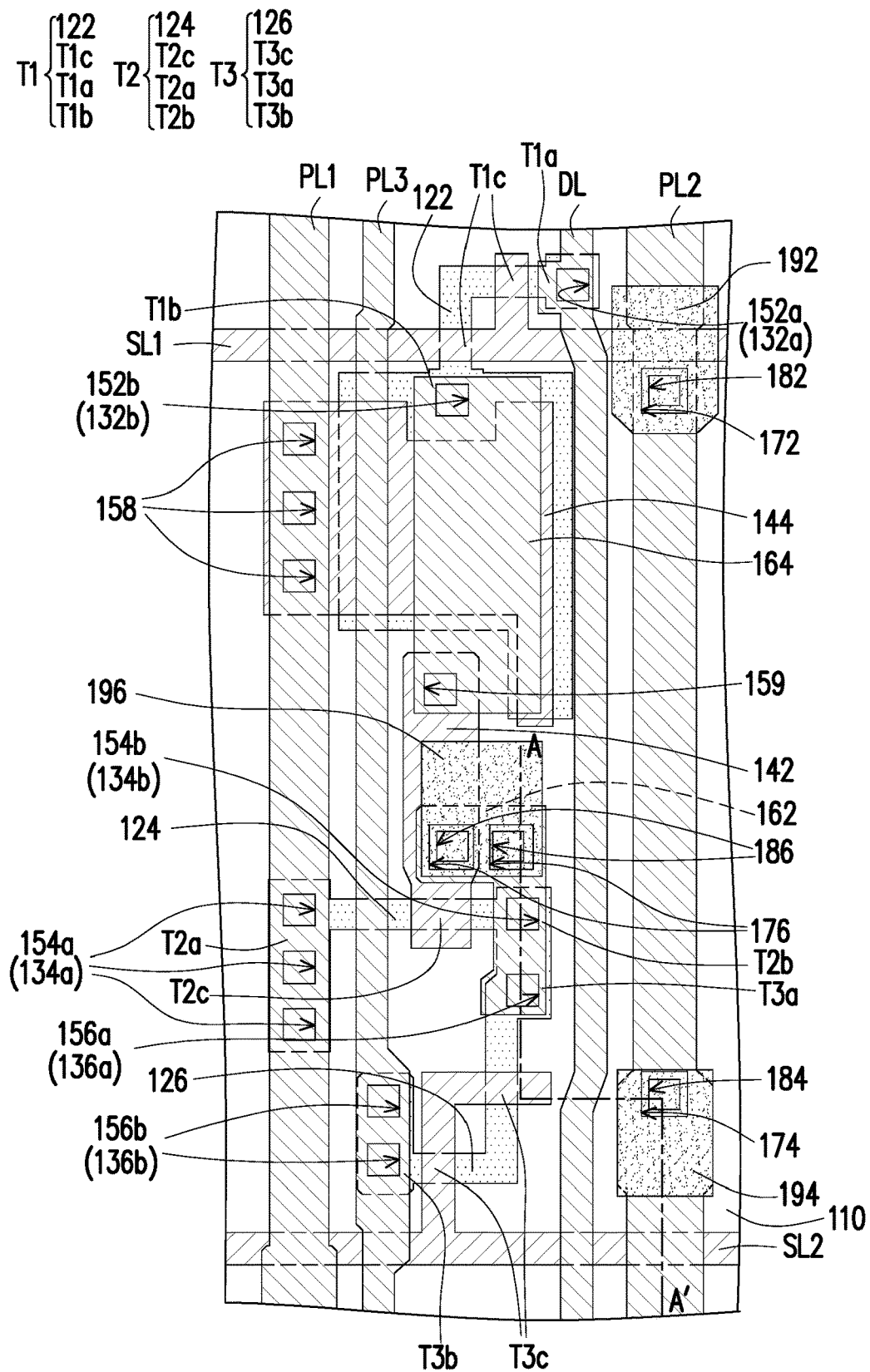
Figure 1G:
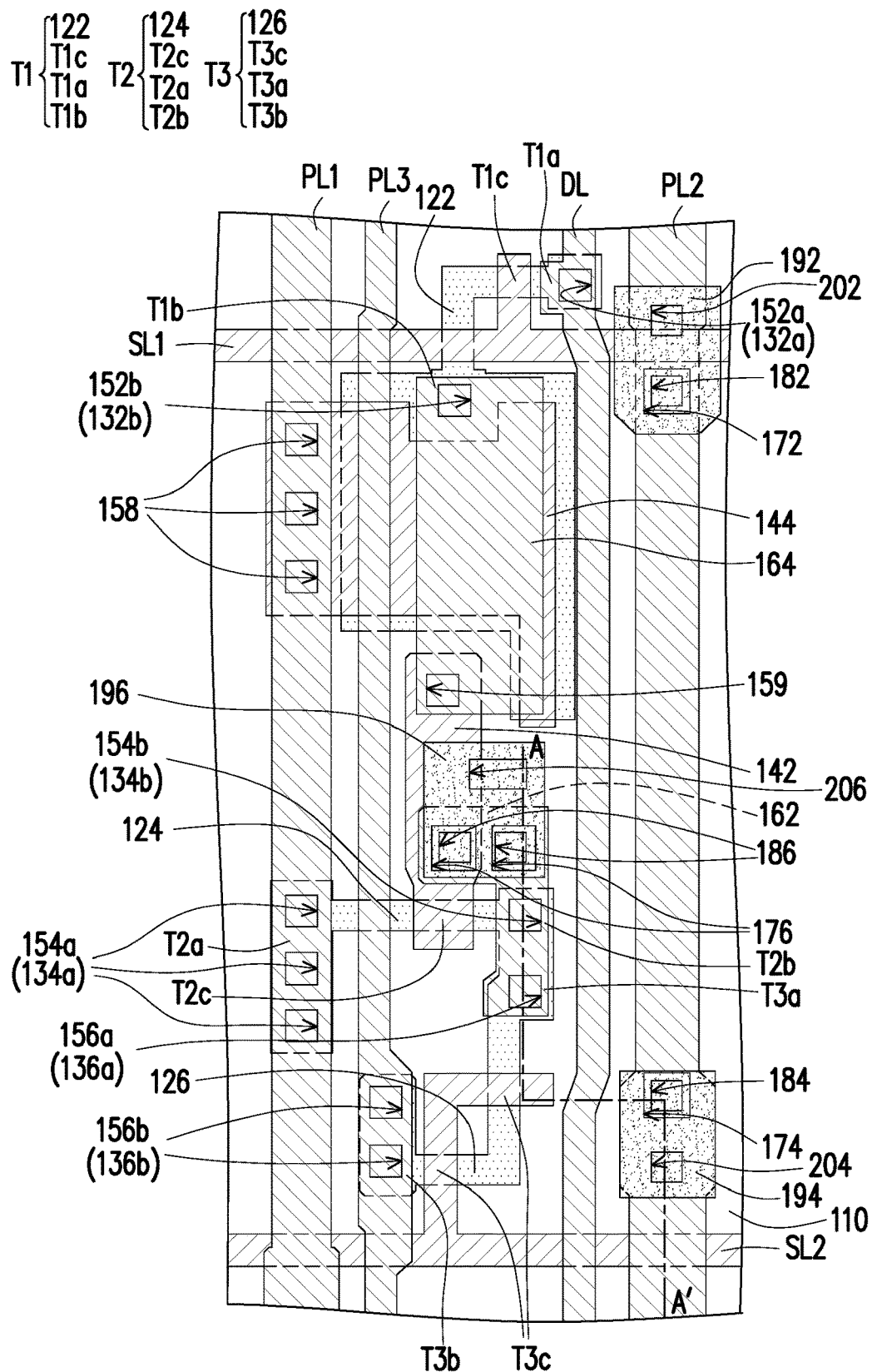
Figure 1H:
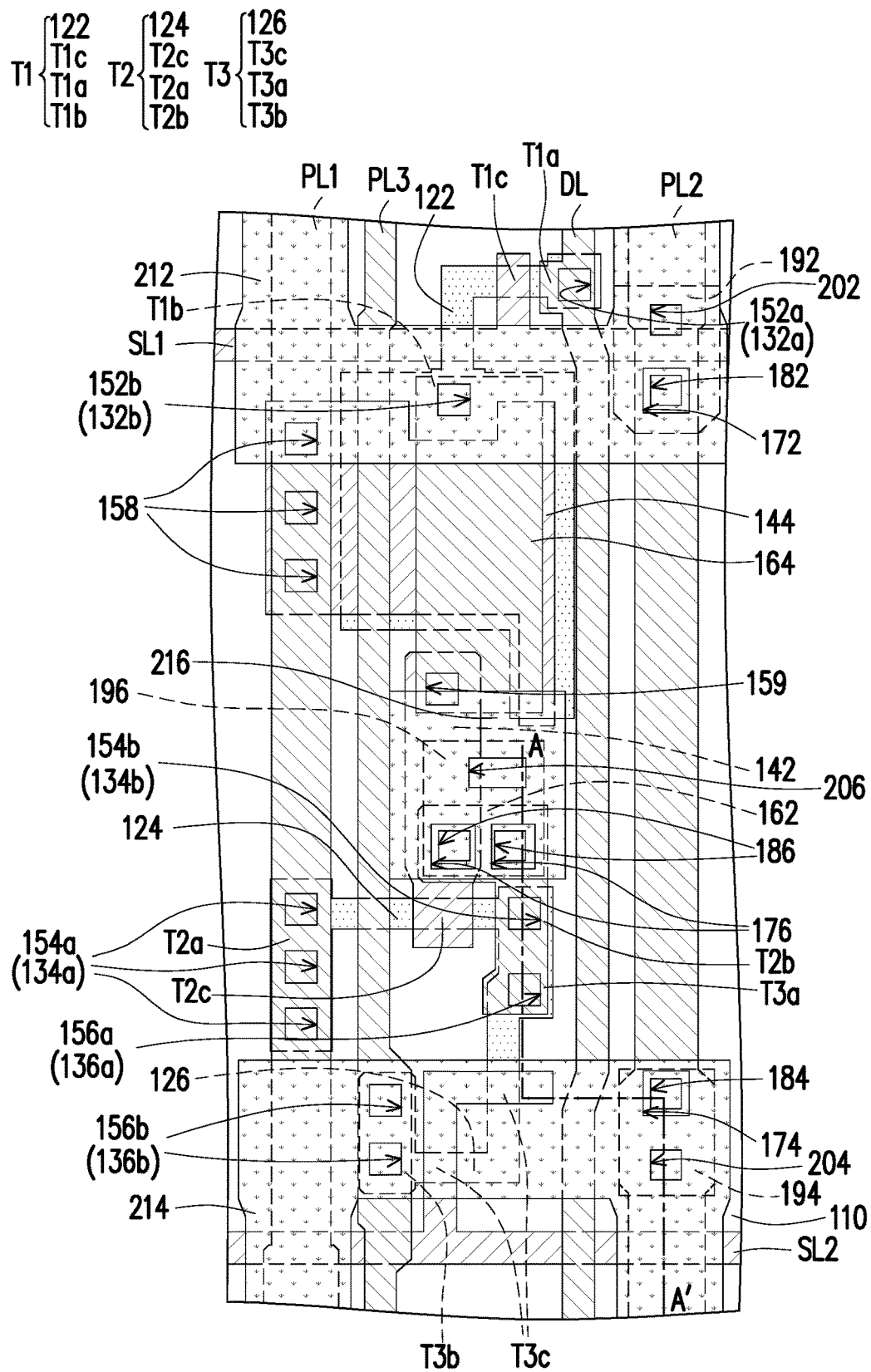
Figure 1I:
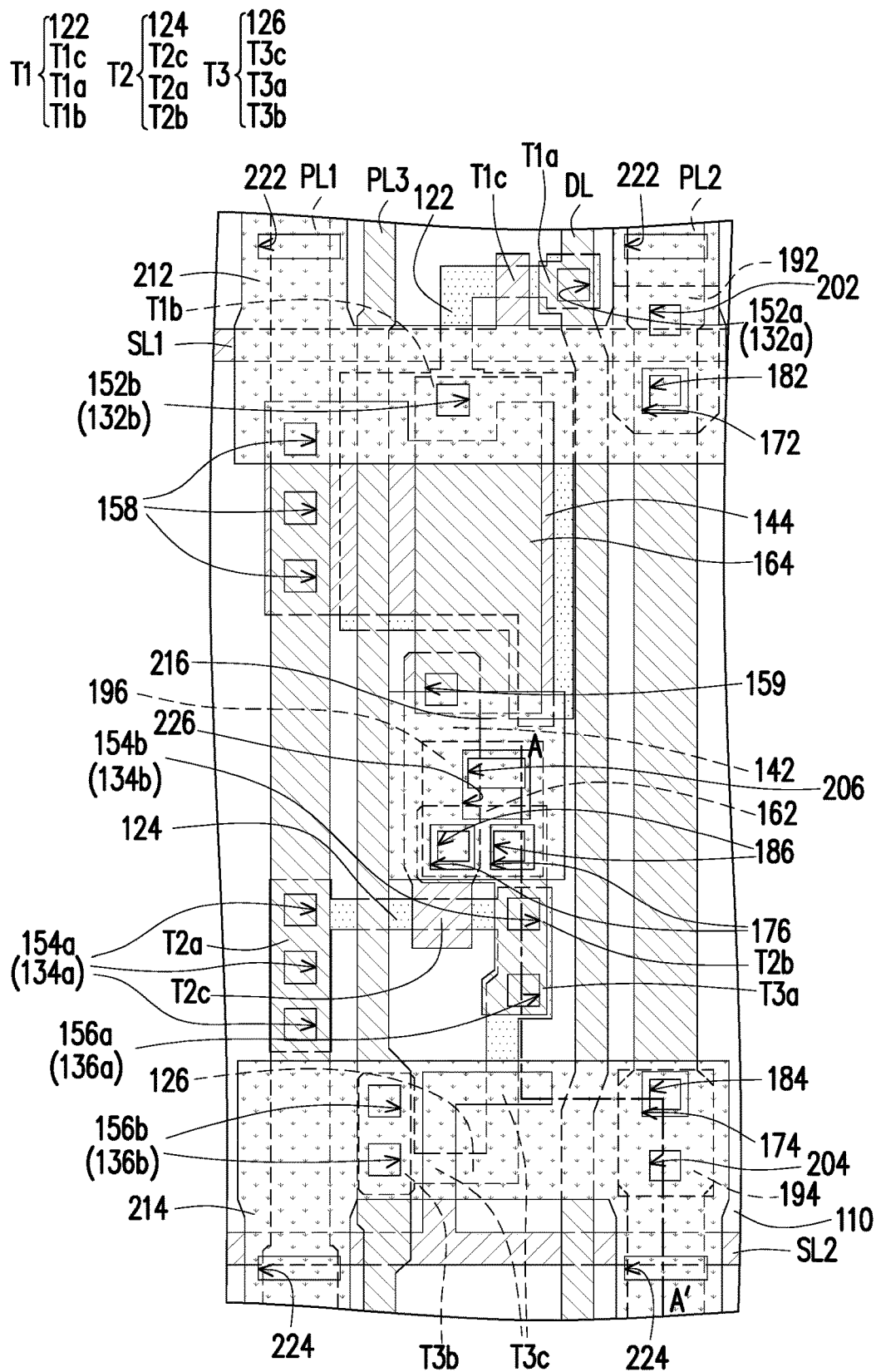
Figure 1J:
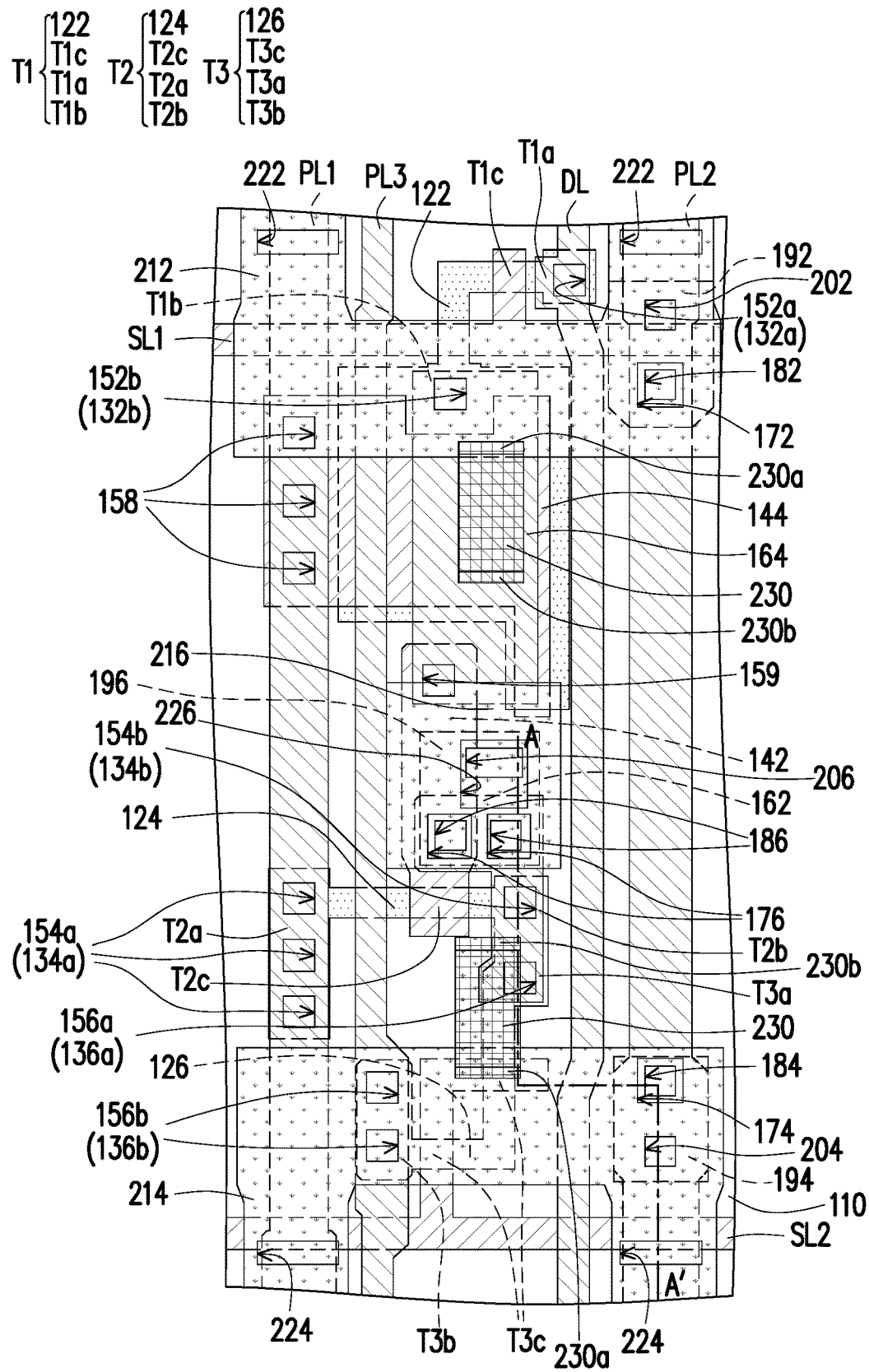

FIG. 1A to FIG. 1K are schematic top views illustrating a process of manufacturing a light-emitting diode (LED) display device according to an embodiment of the invention. FIG. 2A to FIG. 2K are schematic cross-sectional views illustrating a process of manufacturing an LED display device according to an embodiment of the invention. Note that FIG. 2A to FIG. 2K respectively corresponds to the sectional line A-A' depicted in FIG. 1A to FIG. 1K. FIG. 3 is a schematic view illustrating an equivalent circuit of a pixel structure of an LED display device according to an embodiment of the invention.

Figure 1K:
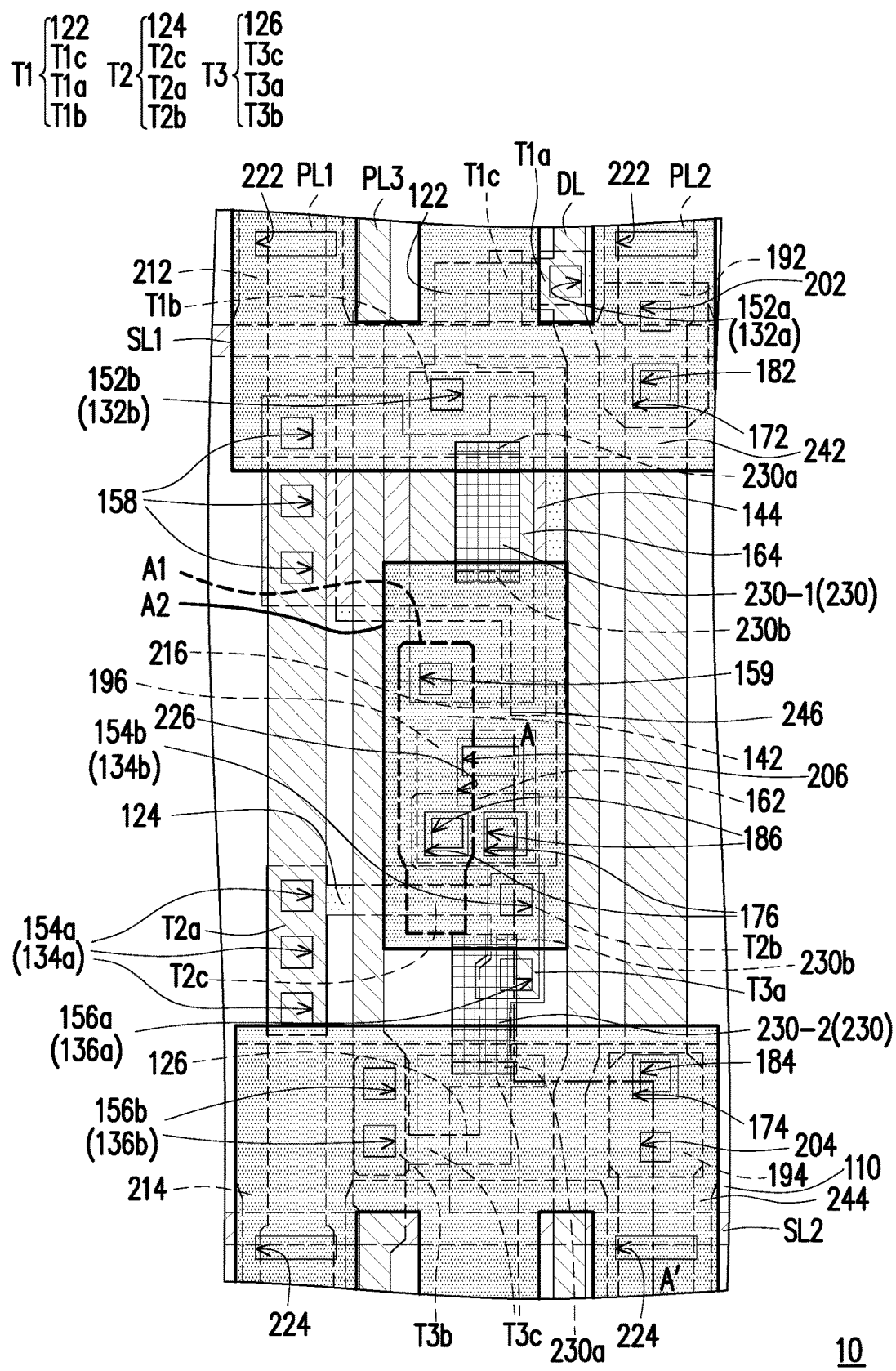
Figure 2A:
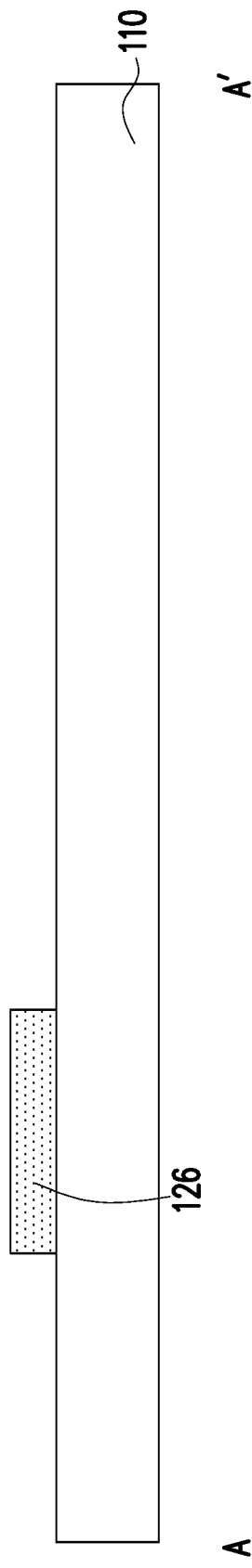
Figure 2B:
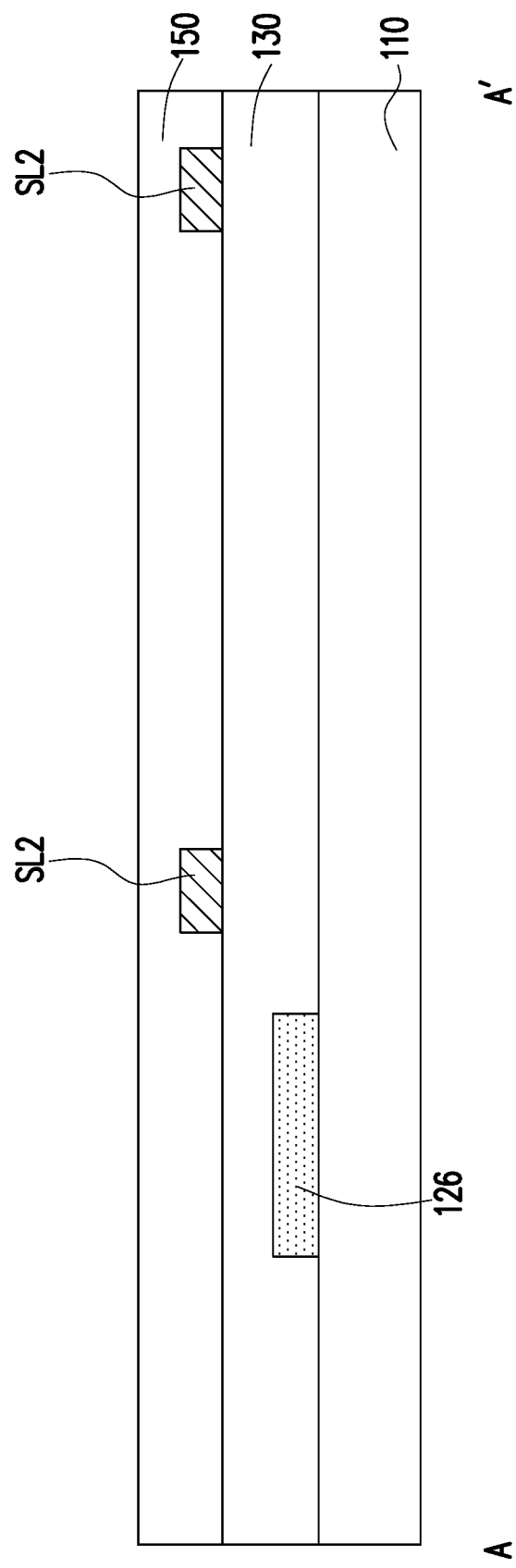
Figure 2C:
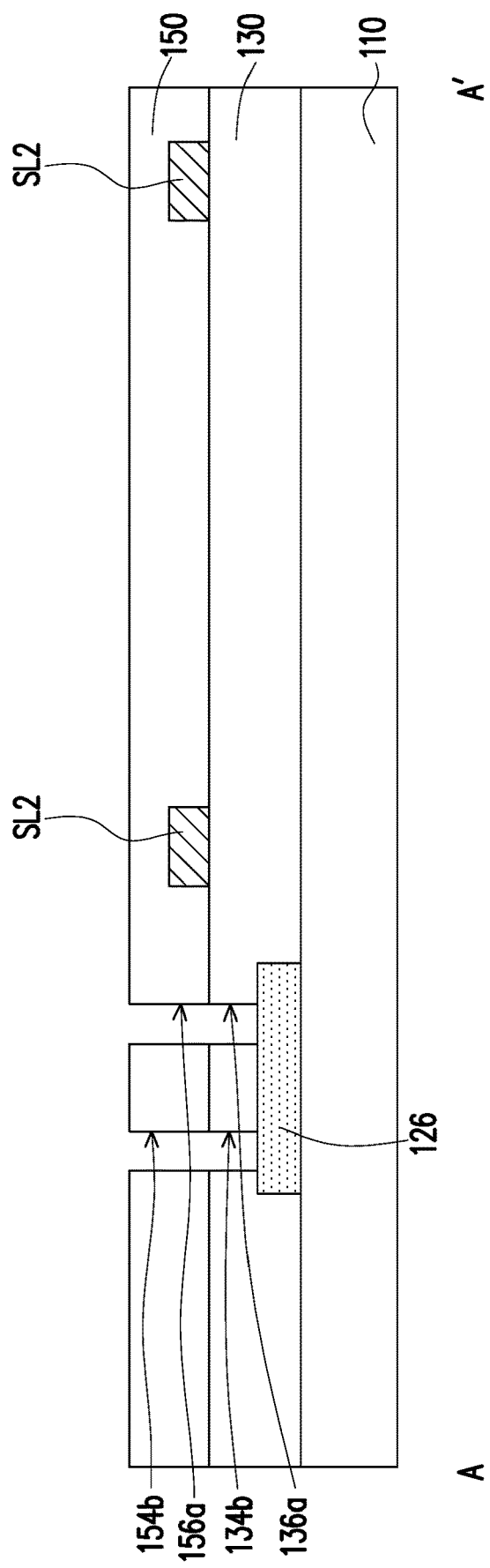
Figure 2D:
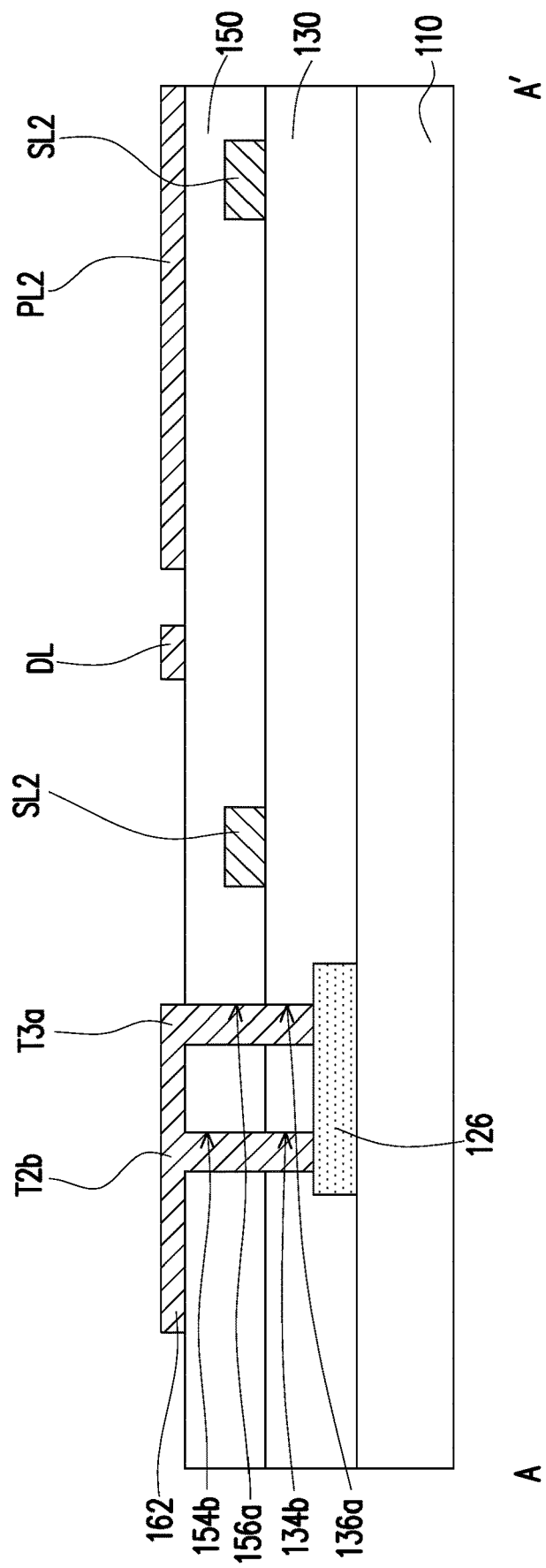
Figure 2E:
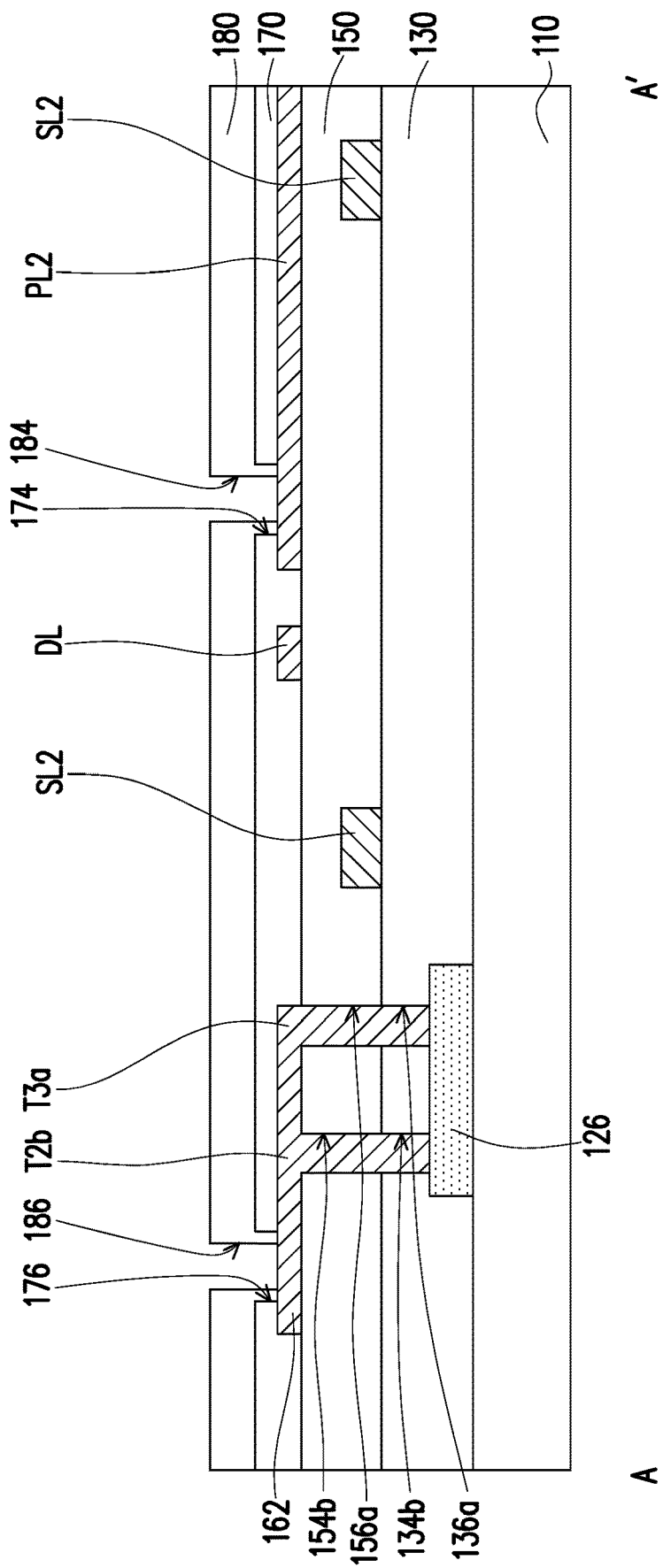
Figure 2F:
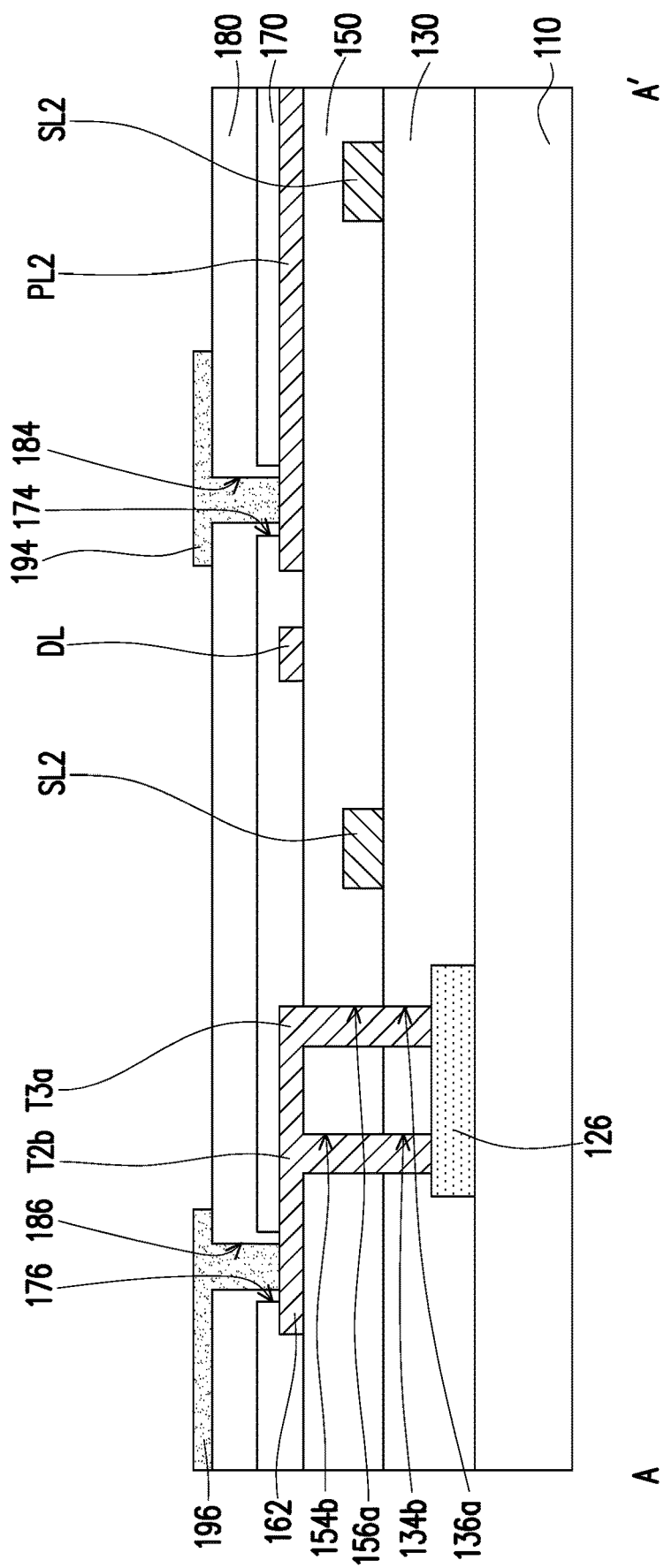
Figure 2G:
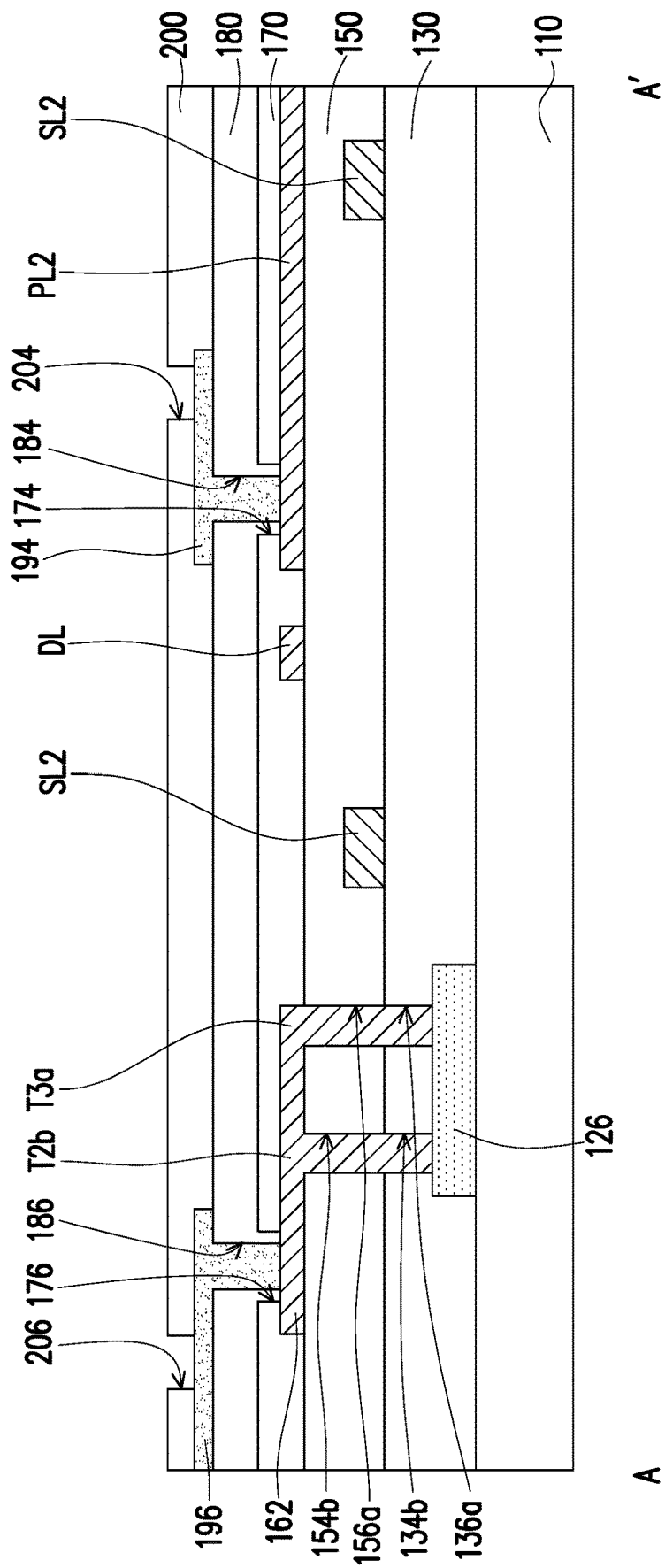
Figure 2H:
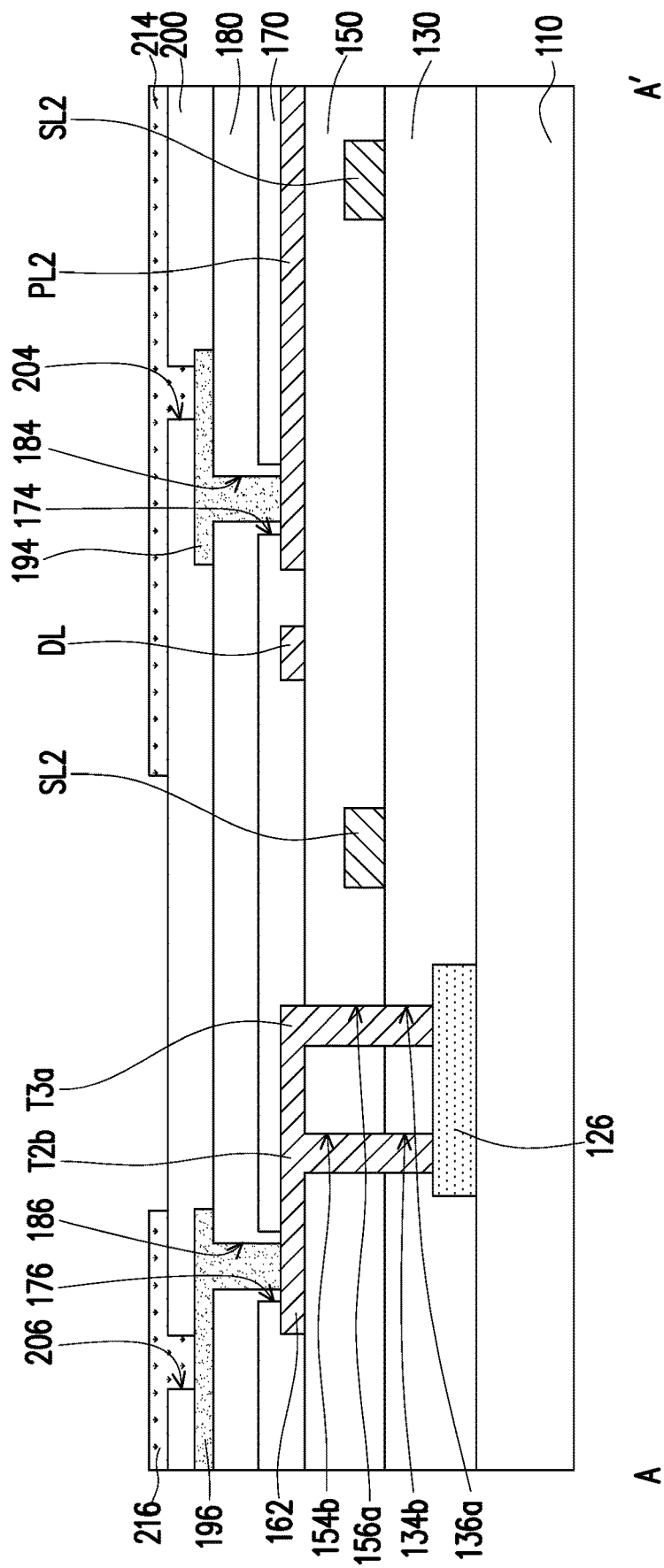
Figure 21:
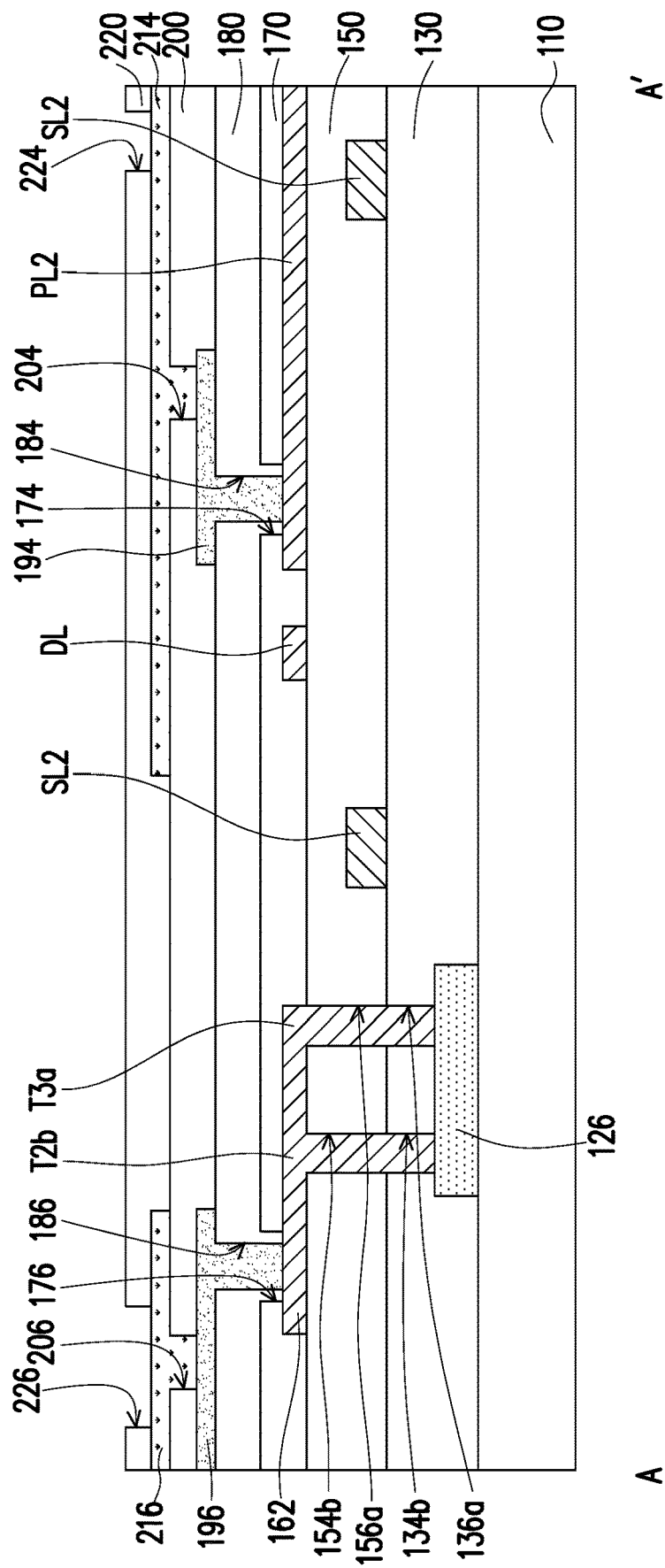
Figure 2J:
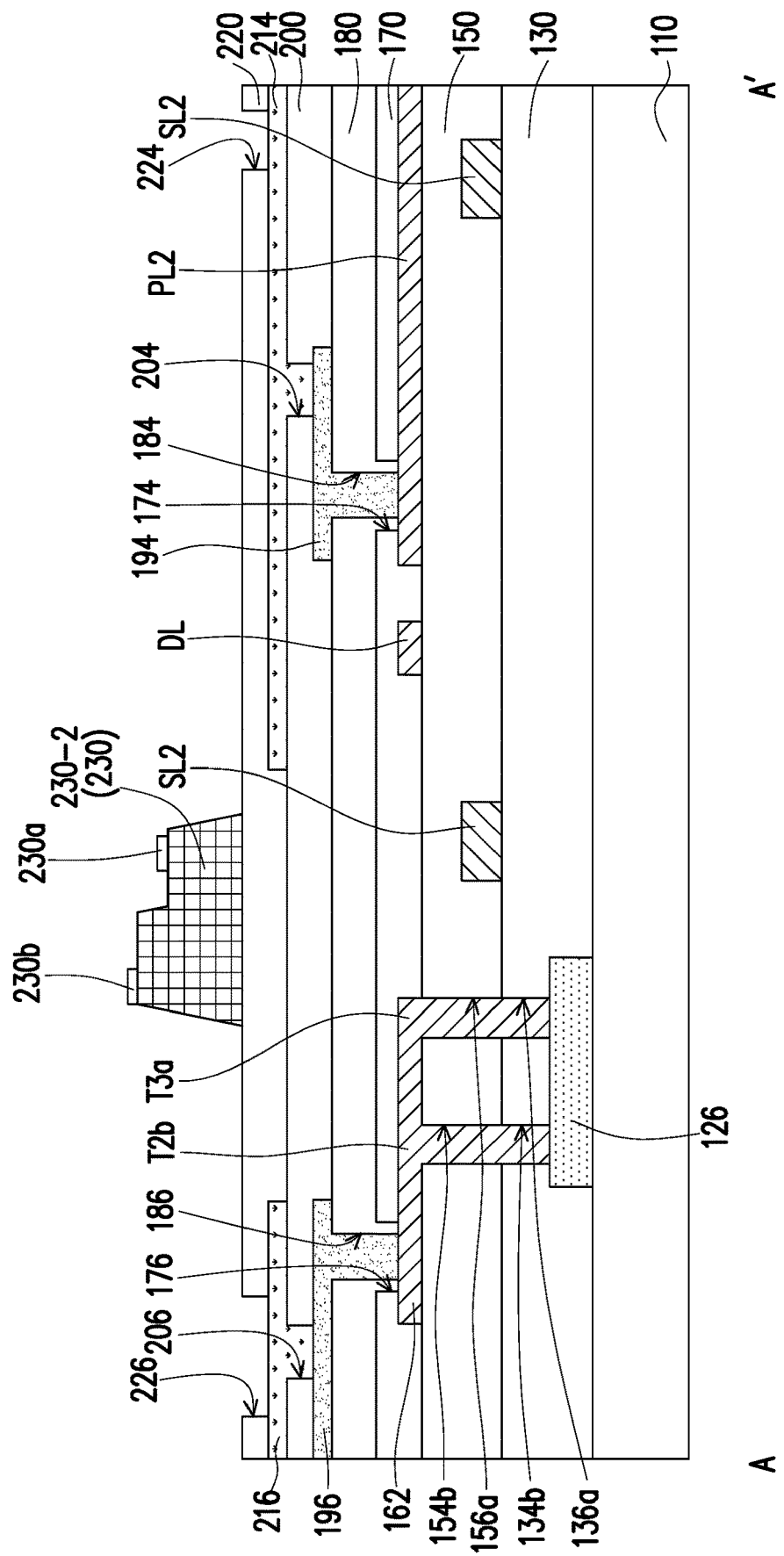
Figure 2K:
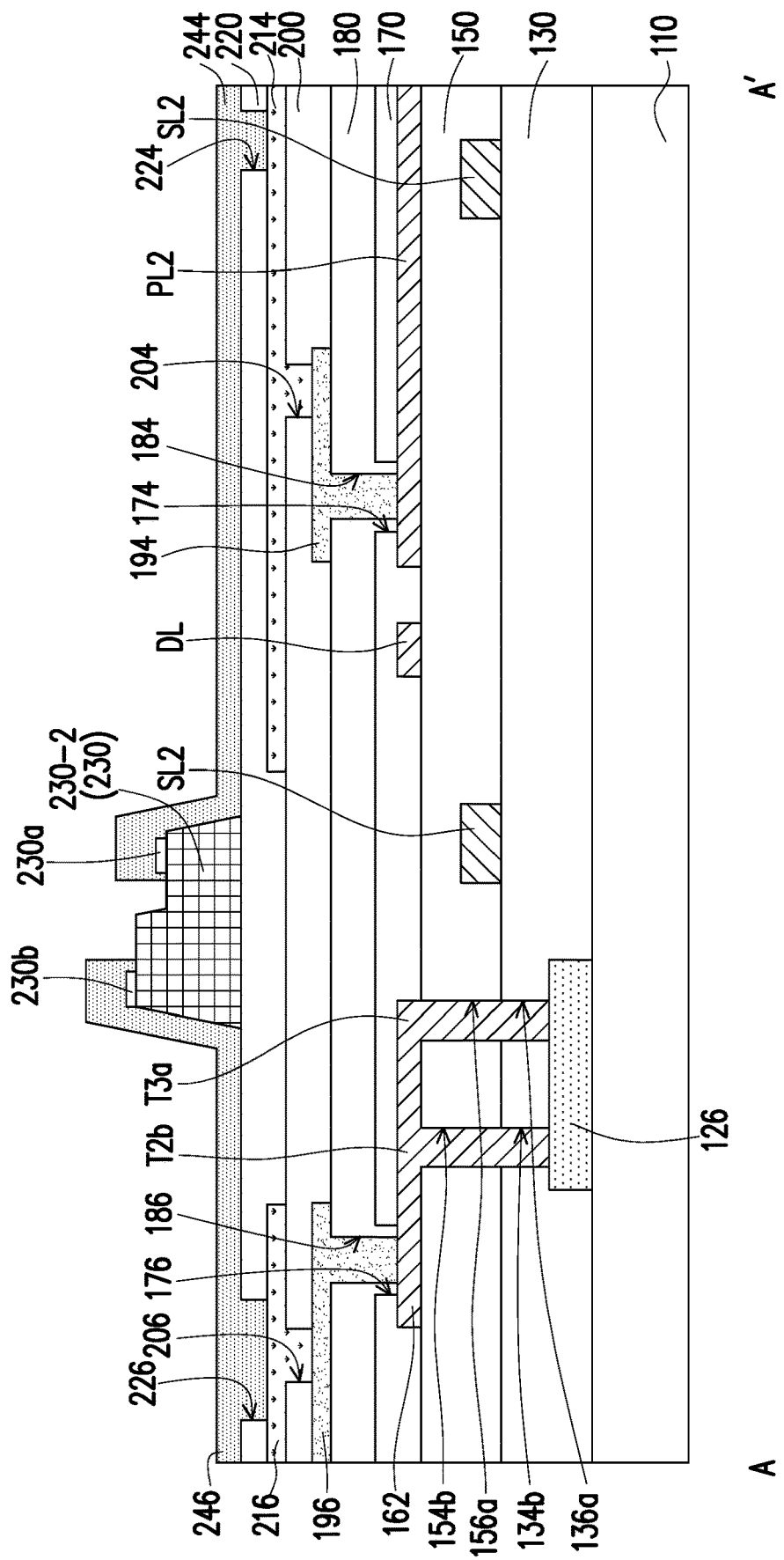
Figure 3:
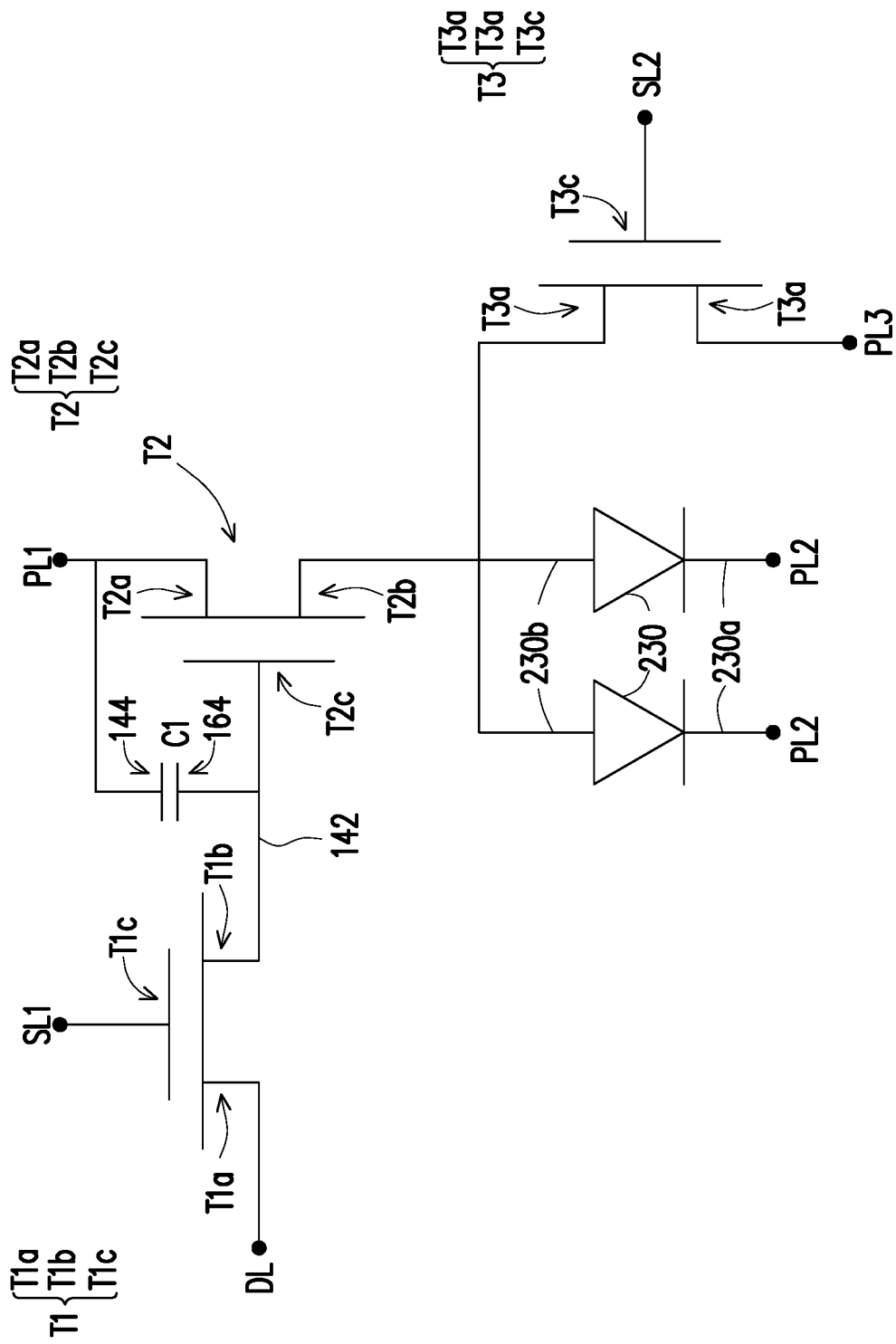
FIG. 3 is a schematic view illustrating an equivalent circuit of a pixel structure of an LED display device according to an embodiment of the invention.

With reference to FIG. 1K, FIG. 2K and FIG. 3, the LED display device includes a plurality of pixel structures 10. For instance, the LED display device can include the pixel structures 10 arranged in an array. FIG. 1K merely illustrates one pixel structure 10 as an example. However, the invention is not limited thereto, and the number of the pixel structures 10 in the LED display device can be determined according to actual requirements (e.g., the panel size and the resolution). People having ordinary skill in the art should be able to achieve the LED display device provided in one or more embodiments of the invention according to the specification and the drawings, and further descriptions are exemplarily provided with reference to FIG. 1A to FIG. 1K, FIG. 2A to FIG. 2K, and FIG. 3.

With reference to FIG. 1A and FIG. 2A, a substrate 110 is provided at first. In the present embodiment, the substrate 110 is optionally a transparent substrate and is made of glass, quartz, organic polymer, or any other appropriate material. However, the invention is not limited thereto; in other embodiments, the substrate 110 may be optionally an opaque/reflective substrate and may be made of a conductive material, a wafer, ceramics, or any other appropriate material.

In the present embodiment, a semiconductor layer including a plurality of semiconductor patterns 122, 124, and 126 can then be formed on the substrate 110. For instance, the semiconductor patterns 122, 124, and 126 can be made of amorphous silicon, polycrystalline silicon, microcrystalline silicon, monocrystalline silicon, an organic semiconductor material, an oxide semiconductor material (e.g., indium zinc oxide, indium gallium zinc oxide, indium tin zinc oxide, any other appropriate material, or a combination thereof), any other appropriate material, the aforesaid material containing a dopant, or a combination thereof.

With reference to FIG. 1B and FIG. 2B, in the present embodiment, a gate insulation material layer 130' can be formed to cover a plurality of semiconductor patterns 122, 124, and 126. A first conductive layer is formed on the gate insulation material layer 130'. The first conductive layer includes a first scan line SL1, a second scan line SL2, a connection pattern 142, a conductive pattern T1c, a conductive pattern T2c, a conductive pattern T3c, and an electrode 144. The first scan line SL1 and the conductive pattern T1c are connected, and the conductive pattern T1c and one portion of the semiconductor pattern 122 are overlapped. The connection pattern 142 and the conductive pattern T2c are connected, and the conductive pattern T2c and one portion of the semiconductor pattern 124 are overlapped. The second scan line SL2 and the conductive pattern T3c are connected, and the conductive pattern T3c and one portion of the semiconductor pattern 126 are overlapped. For instance, according to the present embodiment, the first scan line SL1 and the second scan line SL2 can be substantially parallel to each other; the connection pattern 142 and the electrode 144 can be separated from each other and can be selectively disposed between the first scan line SL1 and the second scan line SL2, which should however not be construed as limitations to the invention.

With reference to FIG. 1B and FIG. 2B, in the present embodiment, an interlayer dielectric material layer 150' can be formed to cover the first conductive layer. With reference to FIG. 1B, FIG. 1C, FIG. 2B, and FIG. 2C, the gate insulation material layer 130' and the interlayer dielectric material layer 150' can be optionally patterned with use of one photomask, so as to form a gate insulation layer 130 and an interlayer dielectric layer 150. With reference to FIG. 1C and FIG. 2C, the interlayer dielectric layer 150 has through holes 152a, 152b, 154a, 154b, 156a, 156b, 158, and 159, the gate insulation layer 130 has through holes 132a, 132b, 134a, 134b, 136a, and 136b, and the through holes 152a, 152b, 154a, 154b, 156a, and 156b are respectively aligned to the through holes 132a, 132b, 134a, 134b, 136a, and 136b.

With reference to FIG. 1D and FIG. 2D, in the present embodiment, a second conductive layer can be formed on the interlayer dielectric layer 150. The second conductive layer includes data line DL, first power line PL1, second power line PL2, the compensation line PL3, conductive pattern T1a, conductive pattern T1b, conductive pattern T2a, conductive pattern T2b, conductive pattern T3a, conductive pattern T3b, connection electrode 162 and electrode 164.

With reference to FIG. 1D and FIG. 3, in the present embodiment, the data line DL and the conductive pattern T1a are connected, and the conductive pattern T1a is electrically coupled to the semiconductor pattern 122 through the through holes 152a and 132a. The conductive pattern T1b is electrically coupled to the semiconductor pattern 122 through the through holes 152b and 132b. The conductive pattern T1a, the conductive pattern T1b, the conductive pattern T1c, and the semiconductor pattern 122 constitute a first transistor T1. The conductive pattern T1a, the conductive pattern T1b, and the conductive pattern T1c can be considered as a first end, a control end, and a second end of the first transistor T1.

With reference to FIG. 1D and FIG. 3, in the present embodiment, the first power line PL1 and the conductive pattern T2a are connected, and the conductive pattern T2a is electrically coupled to the semiconductor pattern 124 through the through holes 154a and 134a. The conductive pattern T2b is electrically coupled to the semiconductor pattern 124 through the through holes 154b and 134b. The conductive pattern T2a, the conductive pattern T2b, the conductive pattern T2c, and semiconductor pattern 124 constitute a second transistor T2. The conductive pattern T2a, the conductive pattern T2b, and the conductive pattern T2c can be considered as a first end, a control end, and a second end of the second transistor T2. The conductive pattern T2b of the second transistor T2 and the connection electrode 162 are connected.

With reference to FIG. 1D and FIG. 3, in the present embodiment, the electrode 164 and the conductive pattern T1b of the first transistor T1 are connected, and the electrode 164 is electrically coupled to the connection pattern 142 through the through hole 159. The connection pattern 142 and the conductive pattern T2c of the second transistor T2 are connected as well. That is, the connection pattern 142 is electrically coupled between the conductive pattern T1c of the first transistor T1 and the conductive pattern T2c of the second transistor T2. Besides, in the present embodiment, the electrode 164 and the electrode 144 are overlapped to form a capacitor C1. The capacitor C1 is electrically coupled between the first power line PL1 and the conductive pattern T2c of the second transistor T2.

With reference to FIG. 1D and FIG. 3, in the present embodiment, the connection electrode 162 and the conductive pattern T3a are connected, and the conductive pattern T3a is electrically connected to the semiconductor pattern 126 through the through holes 156a and 134a. The compensation line PL3 and the conductive pattern T3b are connected, and the conductive pattern T3b is electrically connected to the semiconductor pattern 126 through the through holes 156b and 136b. The conductive pattern T3a, the conductive pattern T3b, the conductive pattern T3c, and the semiconductor pattern 126 constitute a third transistor T3. The conductive pattern T3a, the conductive pattern T3b, and the conductive pattern T3c can be considered as a first end, a control end, and a second end of the third transistor T3. The conductive pattern T3a of the third transistor T3 and the connection electrode 162 are connected. The conductive pattern T3c of the third transistor T3 is electrically coupled to the second scan line SL2. The conductive pattern T3b of the third transistor T3 is electrically coupled to the compensation line PL3.

With reference to FIG. 1D, for instance, in the present embodiment, the data line DL, the first power line PL1, the second power line PL2, and the compensation line PL3 can be substantially arranged in parallel and cross over with the first scan line SL1 and the second scan line SL2; the connection electrode 162 and the electrode 164 can be separated from each other and can be selectively disposed between the data line DL and the compensation line PL3, which should however not be construed as limitations to the invention.

With reference to FIG. 1E and FIG. 2E, in the present embodiment, a first insulation layer 170 can be formed on the second conductive layer. Thereafter, a fourth insulation layer 180 is formed on the first insulation layer 170. The first insulation layer 170 has through holes 172, 174, and 176, and the fourth insulation layer 180 has 1 through holes 182, 184, and 186, wherein the through holes 172, 174, and 176 and the through holes 182, 184, and 186 are overlapped, respectively. In the present embodiment, orthogonal projections of the through holes 182, 184, and 186 can be respectively located within orthogonal projections of the through holes 172, 174, and 176, which should however not be construed as a limitation to the invention. In the present embodiment, the through holes 172 and 174 and the second power line PL2 are overlapped, the through hole 176 and the connection electrode 162 are overlapped, and at least one portion of the through holes 176 and 186 and the connection pattern 142 are overlapped in an orthogonal projection direction.

In the present embodiment, a material of the first insulation layer 170 and the fourth insulation layer 180 may be an organic material, and the first insulation layer 170 and the fourth insulation layer 180 may be made of the same material or different materials. However, the invention is not limited thereto, in other embodiments, the first insulation layer 170 and the fourth insulation layer 180 may be made of an inorganic material, e.g., silicon nitride, silicon oxynitride, or silicon oxide.

With reference to FIG. 1F and FIG. 2F, in the present embodiment, a third conductive layer can be formed on the fourth insulation layer 180. The third conductive layer includes a connecting pattern 192, a connecting pattern 194, and a first connecting pattern 196, wherein the first connecting pattern 196 is disposed between the connecting pattern 192 and the connecting pattern 194. The connecting pattern 192 is electrically connected to the second power line PL2 through the through holes 182 and 172. The connecting pattern 194 is electrically connected to the second power line PL2 through the through holes 184 and 174. The first connecting pattern 196 is electrically coupled to the connection electrode 162 through the through holes 186 and 176. In the present embodiment, a material of the third conductive layer may be metal or any other appropriate conductive material, which should however not be construed as a limitation to the invention.

In the present embodiment, the first connecting pattern 196 of the third conductive layer is electrically coupled to the second end (i.e., the conductive pattern T2b) of the second transistor T2 through the through hole 186 of the fourth insulation layer 180 and the through hole 176 of the first insulation layer 170; the conductive pattern 192 is electrically coupled to the second power line PL2 through the through hole 182 and the through hole 172. The conductive pattern 194 is electrically coupled to the second power line PL2 through the through hole 184 and the through hole 174.

With reference to FIG. 1G and FIG. 2G according to the present embodiment, a second insulation layer 200 can be formed to cover the third conductive layer. The second insulation layer 200 has through holes 202, 204, and 206. In the present embodiment, the through hole 202 and the connecting pattern 192 are overlapped, the through hole 204 and the connecting pattern 194 are overlapped, and the through hole 206 and the first connecting pattern 196 are overlapped.

With reference to FIG. 1H and FIG. 2H, according to the present embodiment, a fourth conductive layer can be formed on the second insulation layer 200. The fourth conductive layer is but is not limited to a transparent conductive layer. The fourth conductive layer includes a connecting pattern 212, a connecting pattern 214, and a second connecting pattern 216. The second connecting pattern 216 can be disposed between the connecting pattern 212 and the connecting pattern 214, which should however not be construed as a limitation to the invention. The connecting pattern 212 is electrically connected to the connecting pattern 192 through the through hole 202, the connecting pattern 214 is electrically connected to the connecting pattern 194 through the through hole 204, and the second connecting pattern 216 is electrically coupled to the first connecting pattern 196 through the through hole 206.

With reference to FIG. 1I and FIG. 2I, according to the present embodiment, a third insulation layer 220 can be formed to cover the fourth conductive layer. The third insulation layer 220 has through holes 222, 224, and 226. In the present embodiment, an orthogonal projection of the through hole 226 of the second insulation layer 200 and an orthogonal projection of the through hole 176 of the first insulation layer 170 are located between an orthogonal projection of the first transistor T1 and an orthogonal projection of the third transistor T3. In the present embodiment, an orthogonal projection of the through hole 226 of the third insulation layer 220 can be overlapped with the through hole 206 of the second insulation layer 200. That is, the orthogonal projection of the through hole 226 of the third insulation layer 220 is located between the orthogonal projection of the first transistor T1 and the orthogonal projection of the third transistor T3.

With reference to FIG. 1J and FIG. 2J, according to the present embodiment, a plurality of LED elements 230 can be disposed on the third insulation layer 220, wherein each of the LED elements 230 has a first electrode 230a and a second electrode 230b.

With reference to FIG. 1K and FIG. 2K, according to the present embodiment, a fifth conductive layer can be formed to cover a portion of surfaces of the LED elements 230. The fifth conductive layer has a first conductive pattern 246 and second conductive patterns 242 and 244, and the second conductive patterns 242 and 244 are respectively disposed on two opposite sides of the first conductive pattern 246. In the present embodiment, the first conductive pattern 246 is electrically coupled between a plurality of second electrodes 230b of the LED elements 230, and the second conductive patterns 242 and 244 are electrically coupled between a plurality of first electrodes 230a of the LED elements 230. For instance, the first conductive pattern 246 is electrically coupled between the LED elements 230-1 and 230-2, the second conductive pattern 242 is electrically coupled to the first electrode 230a of the LED element 230-1, and the second conductive pattern 244 is electrically coupled to the first electrode 230a of the LED element 230-2.

In the present embodiment, an orthogonal projection of the first conductive pattern 246 is located between orthogonal projections of the second electrodes 230b of the LED elements 230. That is, the orthogonal projection of the first conductive pattern 246 is located between the orthogonal projections of the second electrodes 230b of the LED elements 230-1 and 230-2.

In the present embodiment, an orthogonal projection of the connection pattern 142 is located between the orthogonal projections of the LED elements 230. For instance, an orthogonal projection of the connection pattern 142 is located between the orthogonal projections of the LED elements 230-1 and 230-2. In the present embodiment, the connection pattern 142 and the first conductive pattern 246 are overlapped in an orthogonal projection direction perpendicular to the substrate 110. In the present embodiment, the orthogonal projection of the connection pattern 142 can be located within the orthogonal projection of the first conductive pattern 246. An area occupied by the orthogonal projection of the connection pattern 142 is A1, an area occupied by the orthogonal projection of the first conductive pattern 246 is A2, and $0.2 \leq A1/A2 < 0.75$. In the present embodiment, the connection pattern 142 and at least one portion of the through hole 226 of the third insulation layer 220 are overlapped in the orthogonal projection direction. In the present embodiment, the connection pattern 142 and at least one portion of the through hole 206 of the second insulation layer 200 are overlapped in the orthogonal projection direction.

In the present embodiment, the first conductive pattern 246 is electrically coupled to the second connecting pattern 216 of the fourth conductive layer through the through hole 226 of the third insulation layer 220, the second conductive pattern 242 is electrically coupled to the connecting pattern 212 of the fourth conductive layer through the through hole 222 of the third insulation layer 220, and the second conductive pattern 244 is electrically coupled to the connecting pattern 214 of the fourth conductive layer through the through hole 224 of the third insulation layer 220.

With reference to FIG. 1K and FIG. 3, in the present embodiment, the second electrodes 230b of the LED elements 230-1 and 230-2 are electrically coupled to the second end of the second transistor T2 and the first end of the third transistor T3 through the first conductive pattern 246, and the first electrodes 230a of the LED elements 230-1 and 230-2 are electrically coupled to the second power line PL2 through the second conductive patterns 242 and 244, respectively. Particularly, the second electrodes 230b of the LED elements 230-1 and 230-2 and the first conductive pattern 246 are connected and electrically coupled to the second end of the second transistor T2 through the through holes 226, 206, 186, and 176; the first electrode 230a of the LED element 230-1 and the second conductive pattern 242 are connected and electrically coupled to the second power line PL2 through the through holes 222, 202, 182, and 172; the first electrode 230a of the LED element 230-2 and the second conductive pattern 244 are connected and electrically coupled to the second power line PL2 through the through holes 224, 204, 184, and 174.

In the present embodiment, the conductive pattern 192 of the third conductive layer is electrically coupled between the second conductive pattern 242 and the second power line PL2; the conductive pattern 194 of the third conductive layer is electrically coupled between the second conductive pattern 244 and the second power line PL2; the first connecting pattern 196 of the third conductive layer is electrically coupled between the first conductive pattern 246 and the second end of the second transistor T2.

In the present embodiment, the fourth conductive layer is electrically coupled to the third conductive layer through the through holes 202, 204, and 206 of the second insulation layer 200 electrically coupled between the fifth conductive layer and the third conductive layer. Specifically, the connecting pattern 212 of the fourth conductive layer is electrically coupled to the connecting pattern 192 of the third conductive layer through the through hole 202 of the second insulation layer 200, electrically coupled to the second conductive pattern 242 of the fifth conductive layer through the through hole 222 of the third insulation layer 220, and electrically coupled between the second conductive pattern 242 and the third conductive layer; the connecting pattern 214 of the fourth conductive layer is electrically coupled to the connecting pattern 194 of the third conductive layer through the through hole 204 of the second insulation layer 200, electrically coupled to the second conductive pattern 244 through the through hole 224 of the third insulation layer 220, and electrically coupled between the second conductive pattern 244 and the third conductive layer; the second connecting pattern 216 of the fourth conductive layer is electrically coupled to the first connecting pattern 196 of the third conductive layer through the through hole 206 of the second insulation layer 200, electrically coupled to the first conductive pattern 246 through the through hole 226 of the third insulation layer 220, and electrically coupled between the first conductive pattern 246 and the third conductive layer.

In view of the above, the pixel structure provided in one or more embodiments of the invention includes the pixel structures having the connection pattern connected between the second end of the first transistor and the control end of the second transistor and the first conductive pattern electrically connected to the second electrodes of two LED elements. When the LED display device is being driven, the electrical signals of the connection pattern and the first conductive pattern are not prone to interfering with each other. The connection pattern and the first conductive pattern whose electrical signals are not prone to mutual interference are overlapped in the orthogonal projection direction, and the area occupied by the pixel structures can be reduced by adjusting the locations of the through holes, so as to improve the resolution of the LED display device.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A pixel structure disposed on a substrate and comprising:
   a data line and a first scan line, crossing over with each other;
   a first transistor having a first end, a control end, and a second end, wherein the first end of the first transistor is electrically coupled to the data line, and the control end of the first transistor is electrically coupled to the first scan line;
   a second transistor having a first end, a control end, and a second end;
   a first power line electrically coupled to the first end of the second transistor;
   a plurality of light-emitting diode elements, wherein each of the plurality of light-emitting diode elements has a first electrode and a second electrode;
   a second power line electrically coupled to first electrodes of the plurality of light-emitting diode elements;
   a connection pattern electrically coupled between the second end of the first transistor and the control end of the second transistor;
   a first insulation layer disposed above the connection pattern; and
   a first conductive pattern disposed above the first insulation layer and electrically coupled between second electrodes of the plurality of light-emitting diode elements, wherein the second electrodes of the plurality of light-emitting diode elements are electrically coupled to the second end of the second transistor through the first conductive pattern, the connection pattern and the first conductive pattern are overlapped in an orthogonal projection direction perpendicular to the substrate, an area occupied by an orthogonal projection of the connection pattern is A1, an area occupied by an orthogonal projection of the first conductive pattern is A2, and $0.2 \leq A1/A2 < 0.75$.

2. The pixel structure according to claim 1, wherein an orthogonal projection of the first conductive pattern is located between a plurality of orthogonal projections of the second electrodes of the plurality of light-emitting diode elements.

3. The pixel structure according to claim 1, wherein an orthogonal projection of the connection pattern is located between a plurality of orthogonal projections of the plurality of light-emitting diode elements.

4. The pixel structure according to claim 1, wherein an orthogonal projection of the connection pattern is within an orthogonal projection of the first conductive pattern.

5. The pixel structure according to claim 1, wherein the first insulation layer has a through hole overlapped with the second end of the second transistor, and the pixel structure further comprises:
   a first connecting pattern disposed on the first insulation layer, electrically coupled to the second end of the second transistor through the through hole of the first insulation layer, and electrically coupled between the first conductive pattern and the second end of the second transistor;
   wherein at least one portion of the through hole and the connection pattern are overlapped in the orthogonal projection direction.

6. The pixel structure according to claim 5, further comprising:

a second insulation layer disposed on the first connecting pattern and having a through hole overlapping the first connecting pattern;

a second connecting pattern disposed on the second insulation layer and located between the first conductive pattern and the second insulation layer, wherein the second connecting pattern is electrically coupled to the first connecting pattern through the through hole of the second insulation layer and electrically coupled between the first conductive pattern and the first connecting pattern, and at least one portion of the through hole of the second insulation layer and the connection pattern are overlapped in the orthogonal projection direction.

7. The pixel structure according to claim 6, further comprising:

a third insulation layer disposed on the second connecting pattern and having a through hole, wherein the first conductive pattern is disposed on the third insulation layer and electrically coupled to the second connecting pattern through the through hole of the third insulation layer, and at least one portion of the through hole of the third insulation layer and the connection pattern are overlapped in the orthogonal projection direction.

8. The pixel structure according to claim 7, further comprising:

a second scan line crossing over with the data line; and a third transistor having a first end, a control end, and a second end, wherein the first end of the third transistor is electrically coupled to the second electrodes of the plurality of light-emitting diode elements, and the control end of the third transistor is electrically coupled to the second scan line;

an orthogonal projection of the at least one portion of the through hole of the third insulation layer is located between an orthogonal projection of the first transistor and an orthogonal projection of the third transistor.

9. The pixel structure according to claim 7, further comprising:

a fourth insulation layer disposed on the first insulation layer and having a through hole, wherein the through hole of the fourth insulation layer and the through hole of the first insulation layer are overlapped, the first connecting pattern is disposed on the fourth insulation layer, and the first connecting pattern is electrically coupled to the second end of the second transistor through the through hole of the fourth insulation layer and the through hole of the first insulation layer.

10. The pixel structure according to claim 5, further comprising:

a second scan line crossing over with the data line; and a third transistor having a first end, a control end, and a second end, wherein the first end of the third transistor is electrically coupled to the second electrodes of the plurality of light-emitting diode elements, and the control end of the third transistor is electrically coupled to the second scan line;

an orthogonal projection of the at least one portion of the through hole of the first insulation layer and an orthogonal projection of at least one portion of the through hole of the second insulation layer are located between an orthogonal projection of the first transistor and an orthogonal projection of the third transistor.

11. The pixel structure according to claim 5, wherein a material of the first insulation layer is an organic material.

* * * * *